United States Patent
Higashi et al.

(10) Patent No.: US 8,717,840 B2
(45) Date of Patent: May 6, 2014

(54) SEMICONDUCTOR MEMORY DEVICE AND METHOD OF CONTROLLING THE SAME

(71) Applicant: Kabushiki Kaisha Toshiba, Tokyo (JP)

(72) Inventors: Yusuke Higashi, Kawasaki (JP); Haruki Toda, Yokohama (JP); Kenichi Murooka, San Jose, CA (US); Satoru Takase, Yokohama (JP); Yuichiro Mitani, Miura-gun (JP); Shuichi Toriyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/773,954

(22) Filed: Feb. 22, 2013

(65) Prior Publication Data

US 2013/0223173 A1 Aug. 29, 2013

(30) Foreign Application Priority Data

Feb. 24, 2012 (JP) ................................. 2012-038567

(51) Int. Cl.
*G11C 7/04* (2006.01)

(52) U.S. Cl.
USPC ................ 365/211; 365/185.11; 365/230.03; 365/185.14; 365/185.28; 365/185.29

(58) Field of Classification Search
USPC .................. 365/211, 185.11, 230.03, 185.14, 365/185.28, 185.29
See application file for complete search history.

(56) References Cited

U.S. PATENT DOCUMENTS

2004/0027908 A1* 2/2004 Ooishi et al. ............. 365/230.03
2011/0032745 A1 2/2011 Ichihara et al.

FOREIGN PATENT DOCUMENTS

JP 2011-40112 2/2011

\* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a semiconductor memory device includes a memory cell array including blocks, each block being capable of executing a write, read, or erase operation independently of other blocks. A control portion is configured to execute the operation of a first block among the blocks in a first cycle, set a selection inhibited region within a range of a predetermined distance from the first block, until a temperature relaxation time for relaxing a temperature of the first block has elapsed, set a region except the selection inhibited region among the blocks as a second block, and execute the operation of the second block in a second cycle.

20 Claims, 28 Drawing Sheets

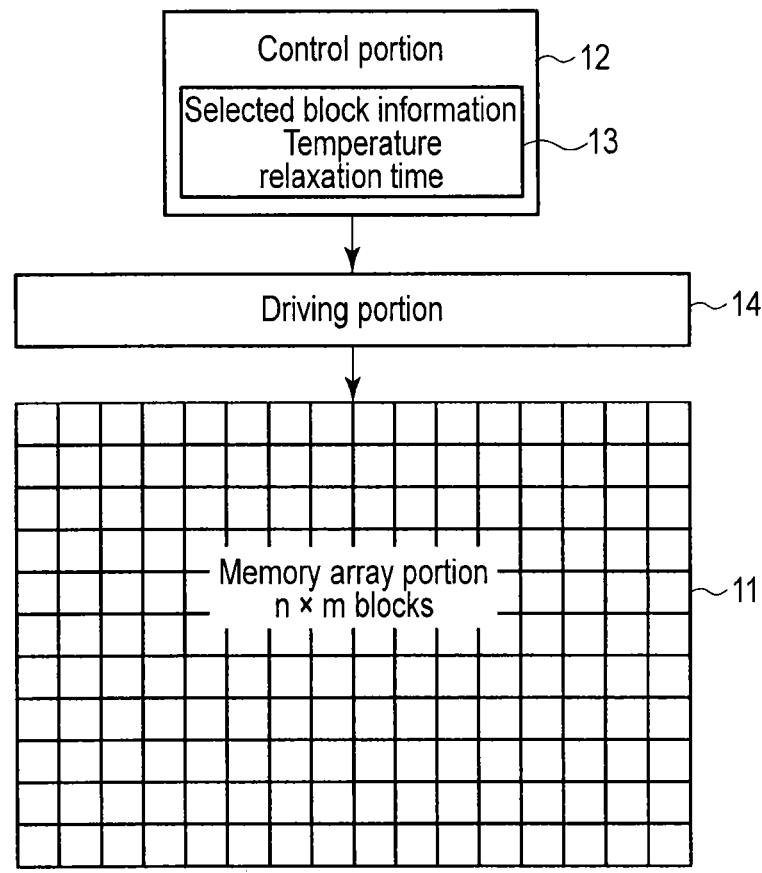
F I G. 1
| Specific operation | Temperature relaxation time |
|---|---|
| Write | $t_{relax-W}$ |
| Erase | $t_{relax-E}$ |
| Read | $t_{relax-R}$ |
F I G. 2

| Specific operation | Flag |
|---|---|
| Write | "H" / "L" |
| Erase | "H" / "L" |
| Read | "H" / "L" |

| Specific operation | Minimum distance $R_{min}$ |
|---|---|
| Write | $R_{min-W}$ |
| Erase | $R_{min-E}$ |
| Read | $R_{min-R}$ |

| Cycle count | 1 | 2 | 3 |  | X |
|---|---|---|---|---|---|
| Selected block (Block address) | B1 | B6 | B12 |  |  |
|  | B2 | B7 | B13 |  |  |
|  | B3 | B8 | B14 | ... |  |
|  | B4 | B9 | B15 |  |  |
|  | B5 | B10 |  |  |  |
|  |  | B11 |  |  |  |
|  |  |  |  |  |  |

F I G. 9

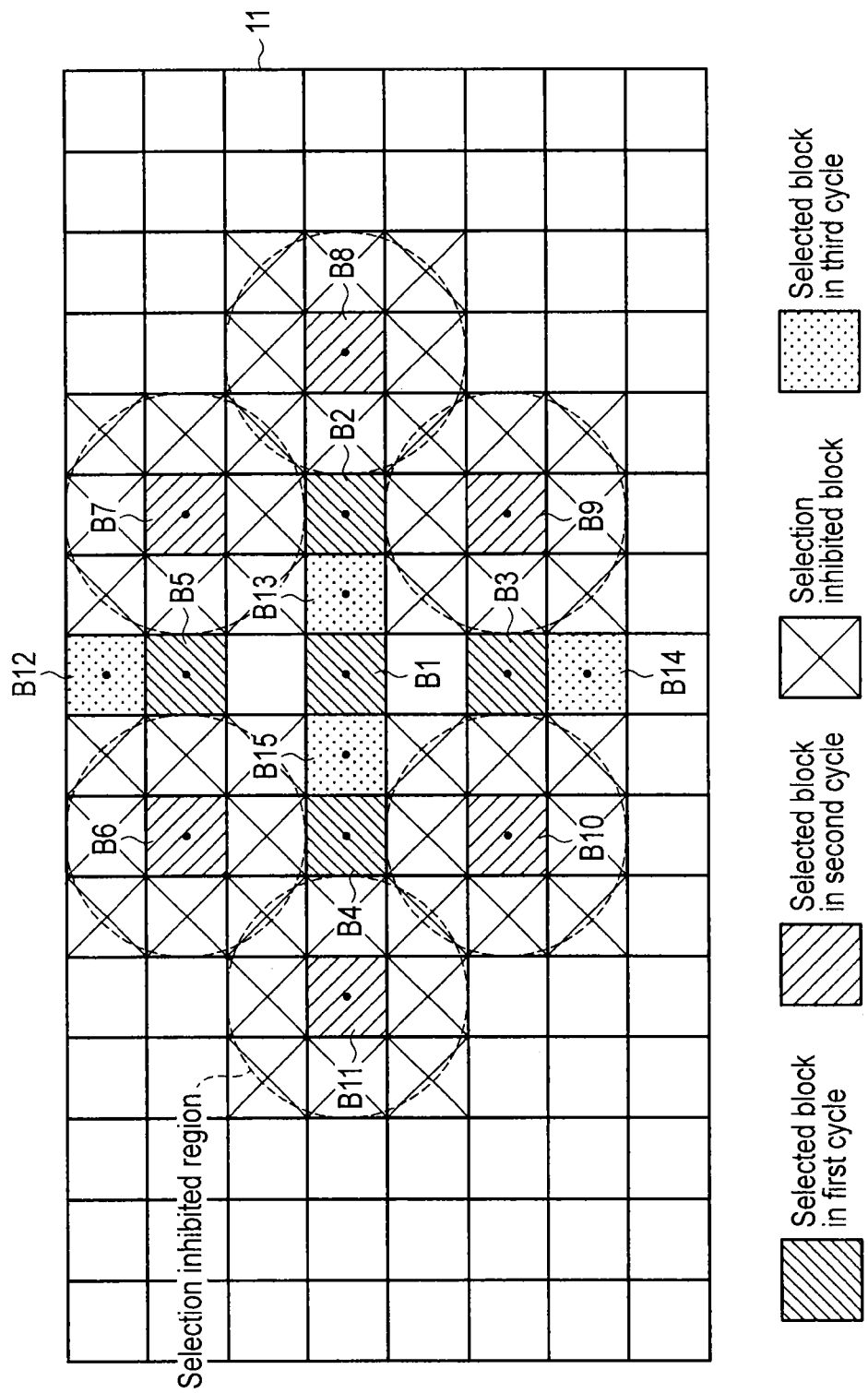
F I G. 11

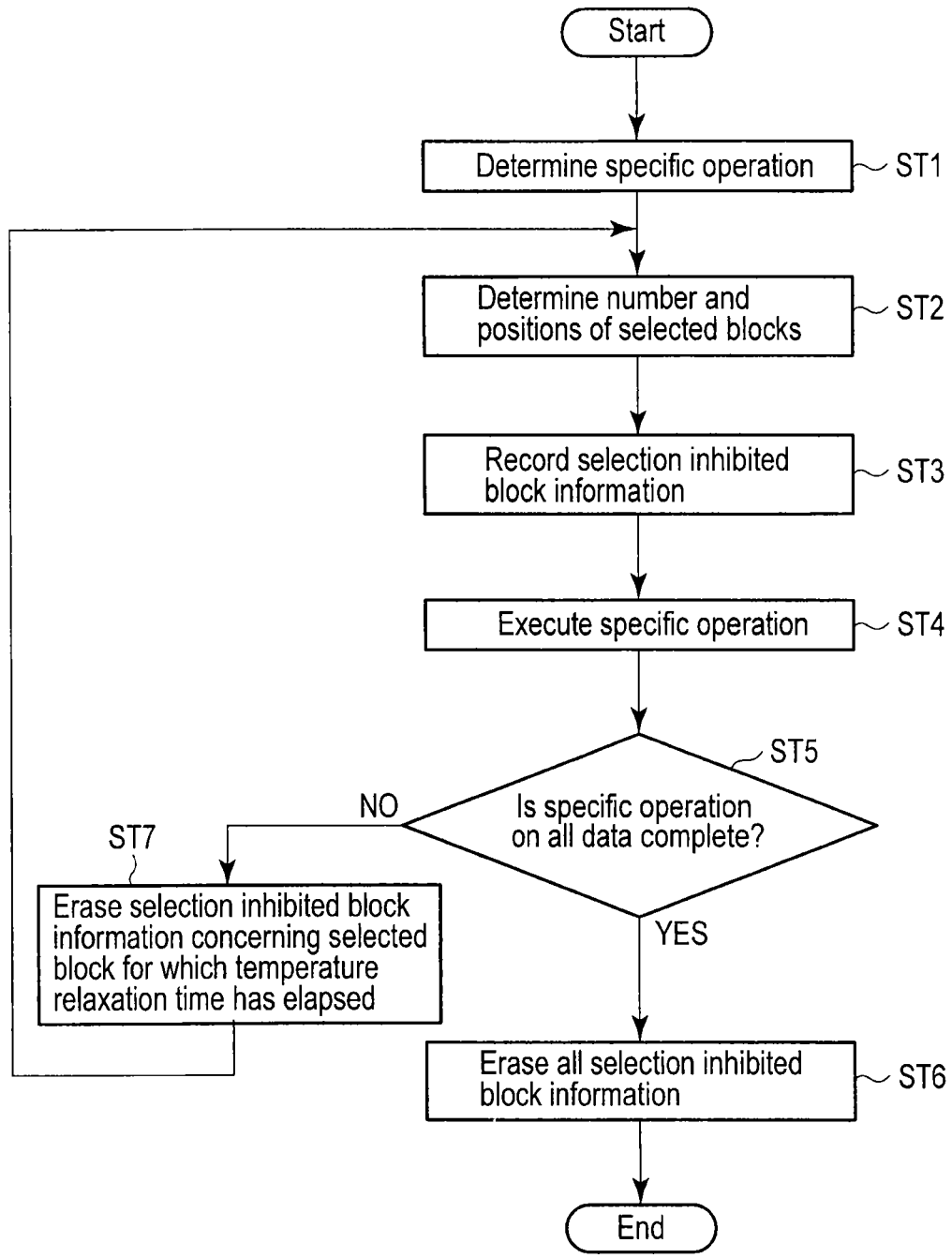
F I G. 13

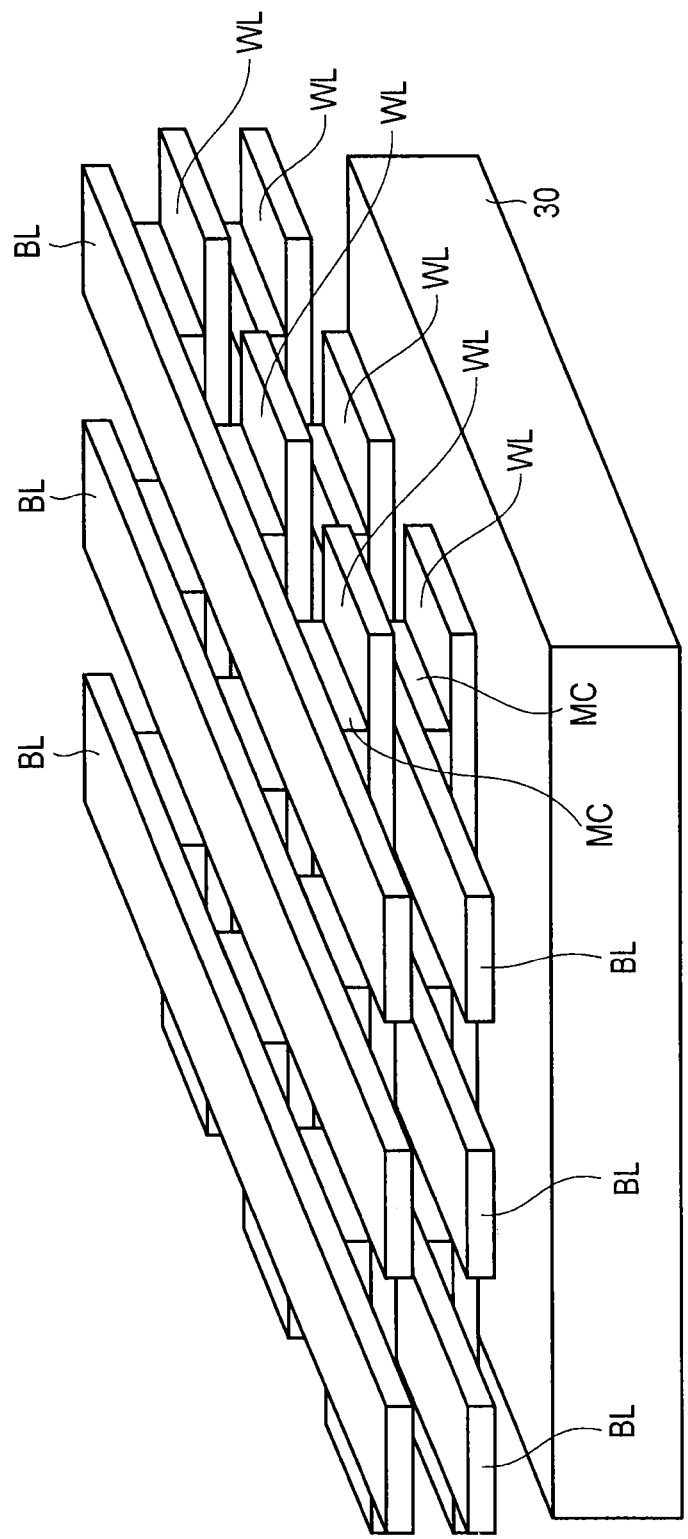
F I G. 16

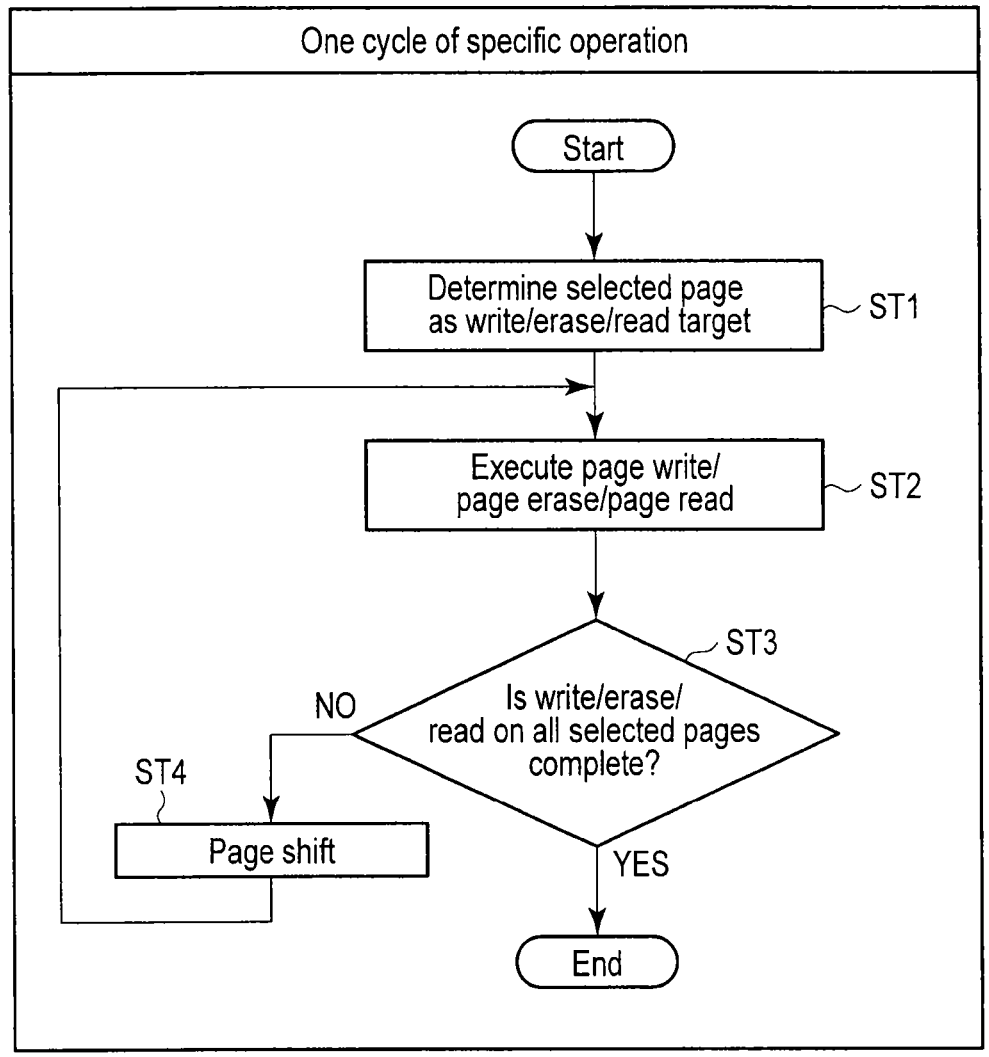
F I G. 20

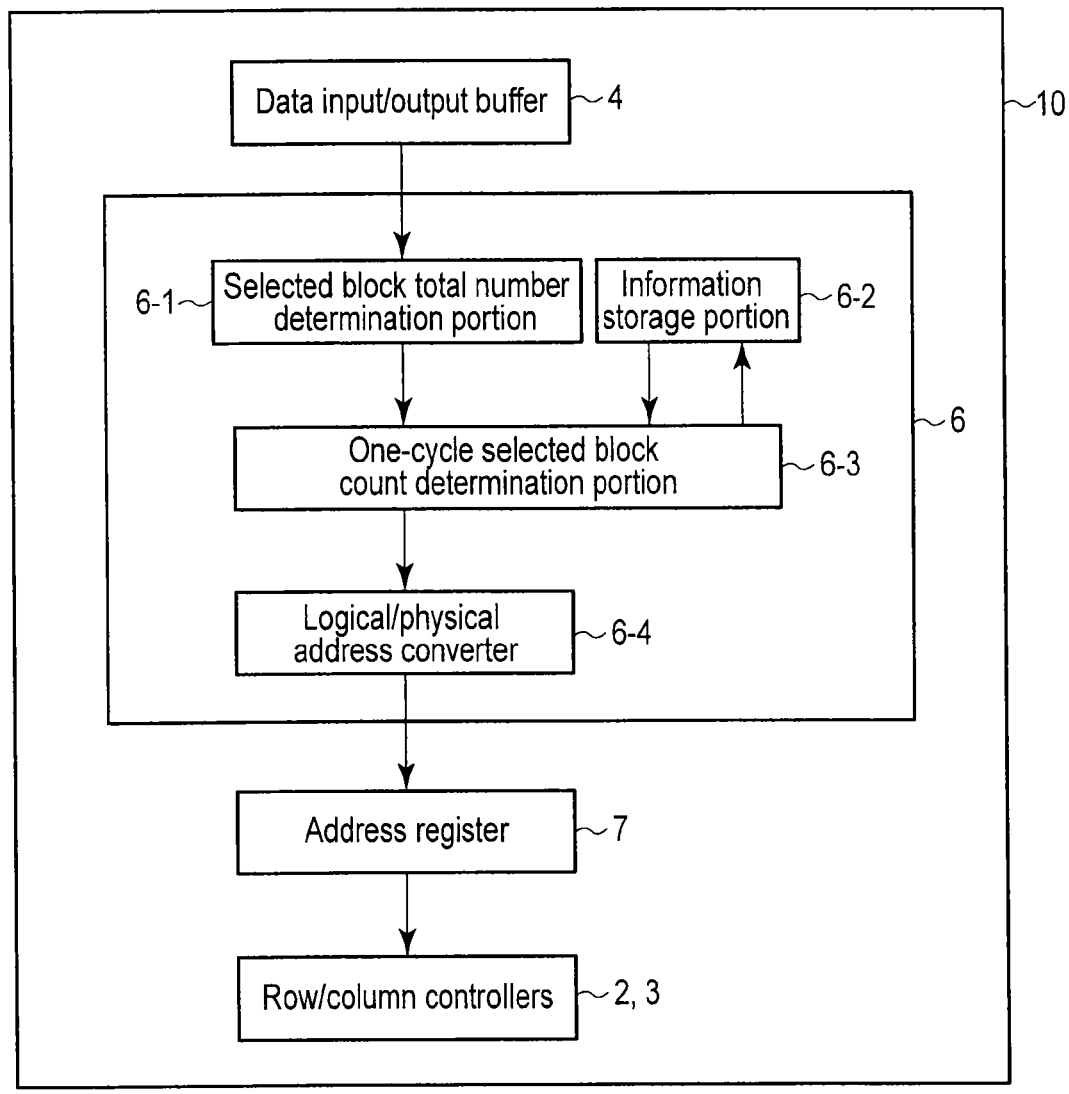
F I G. 21

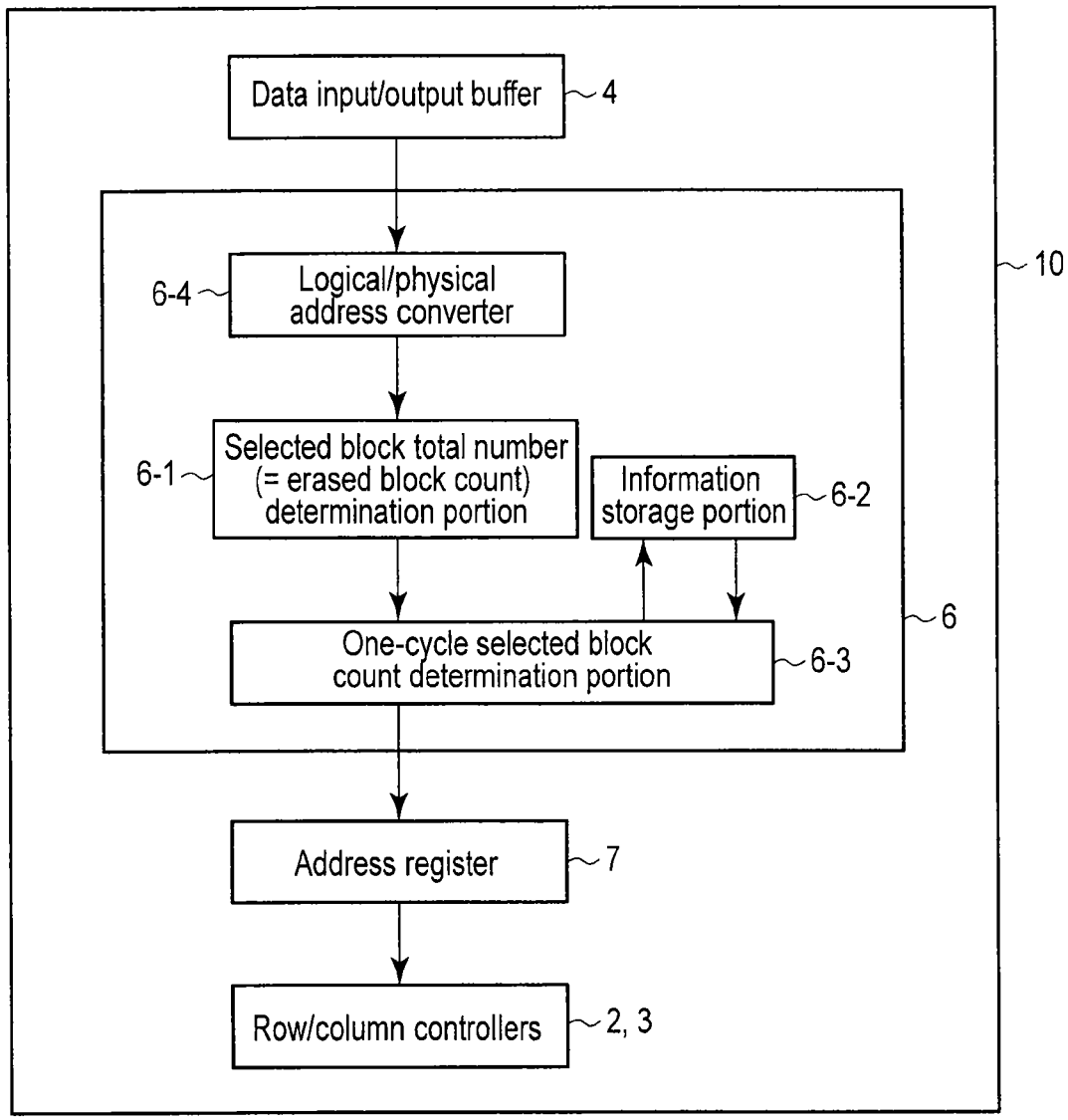
F I G. 22

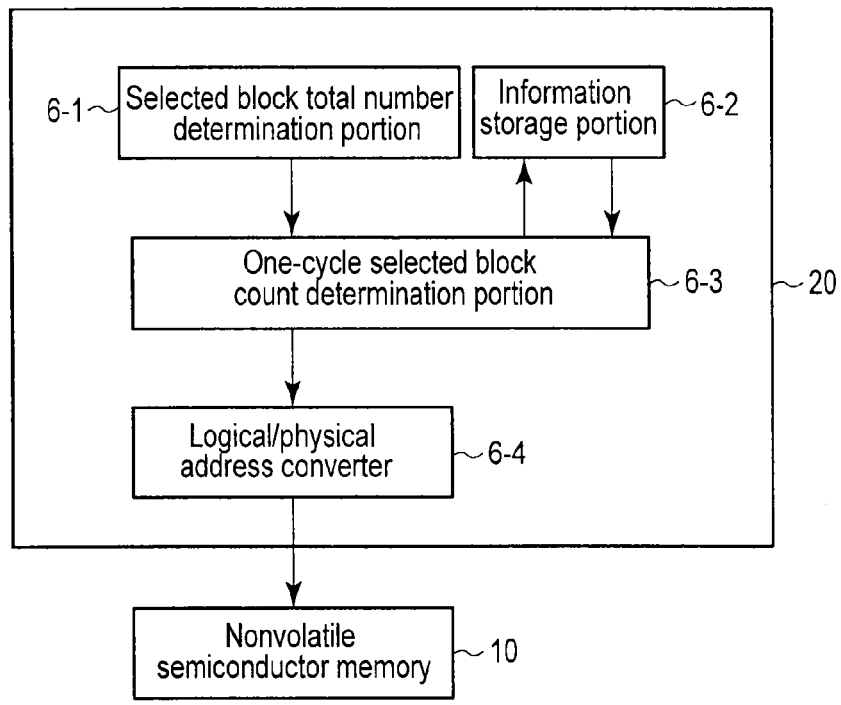
F I G. 23
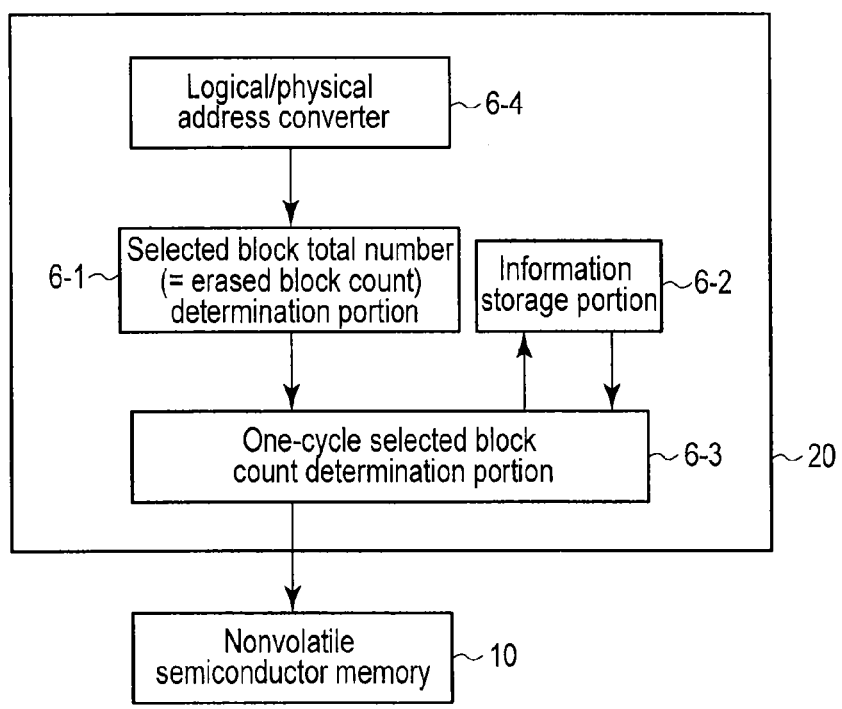
F I G. 24

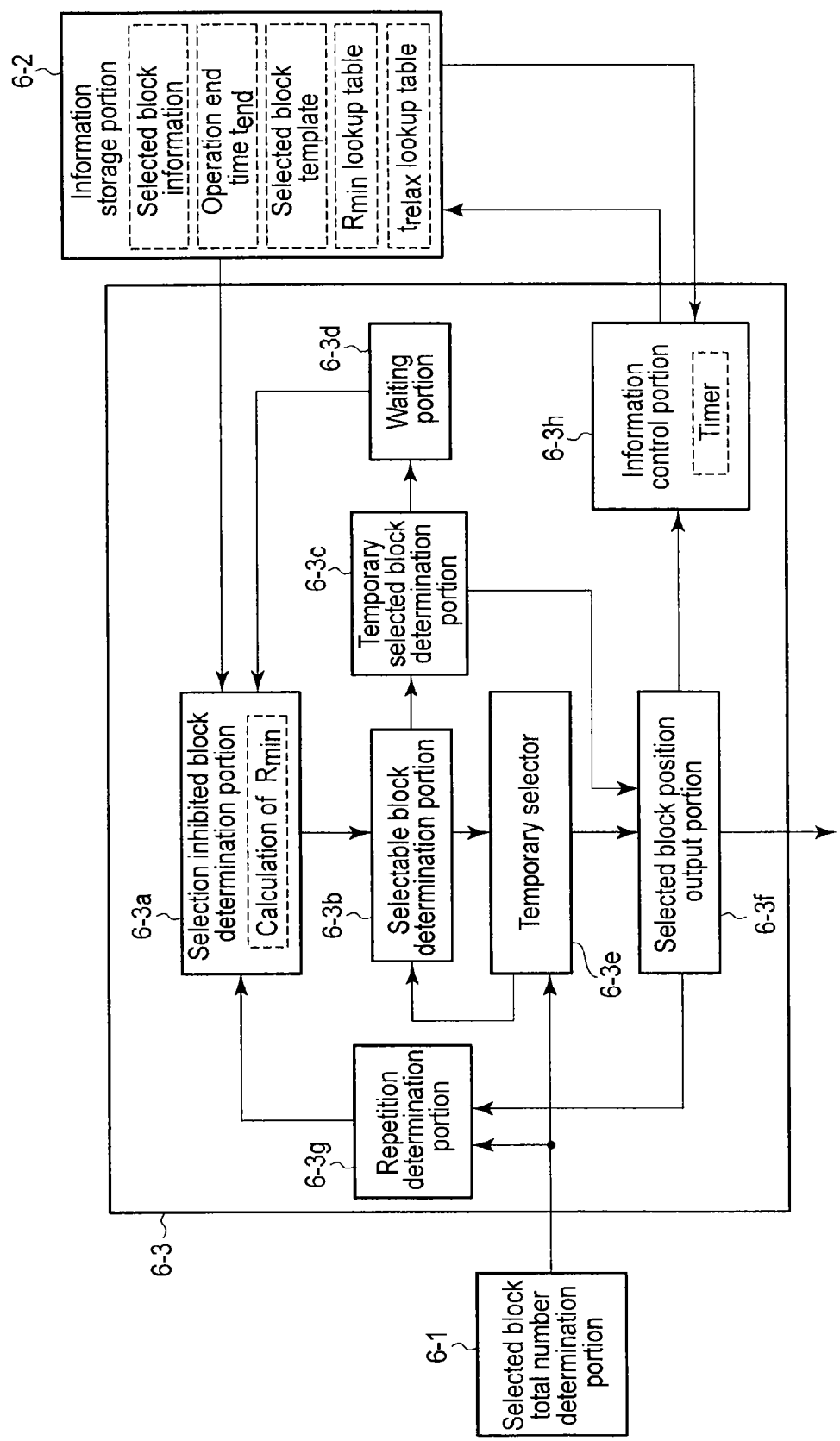
F I G. 26

| Pattern number | R$_{min}$ [mm] |
|---|---|
| No.1 | 2.2 |
| No.2 | 2.4 |
| No.3 | 2.5 |
| No.4 | 2.7 |
| ⋮ | ⋮ |

F I G. 28

| Pattern number | Operation time t$_{set}$ | Temperature relaxation time t$_{relax}$ |
|---|---|---|
| No.1 | 1msec | 1msec |
| | 2msec | 2msec |
| | 5msec | 6msec |
| | 10msec | 12msec |
| | 15msec | 20msec |
| | 20msec | 25msec |
| No.2 | 1msec | 2msec |
| | 2msec | 4msec |
| | 5msec | 10msec |
| | 10msec | 15msec |
| | 15msec | 25msec |
| | 20msec | 30msec |
| ⋮ | ⋮ | ⋮ |

F I G. 29

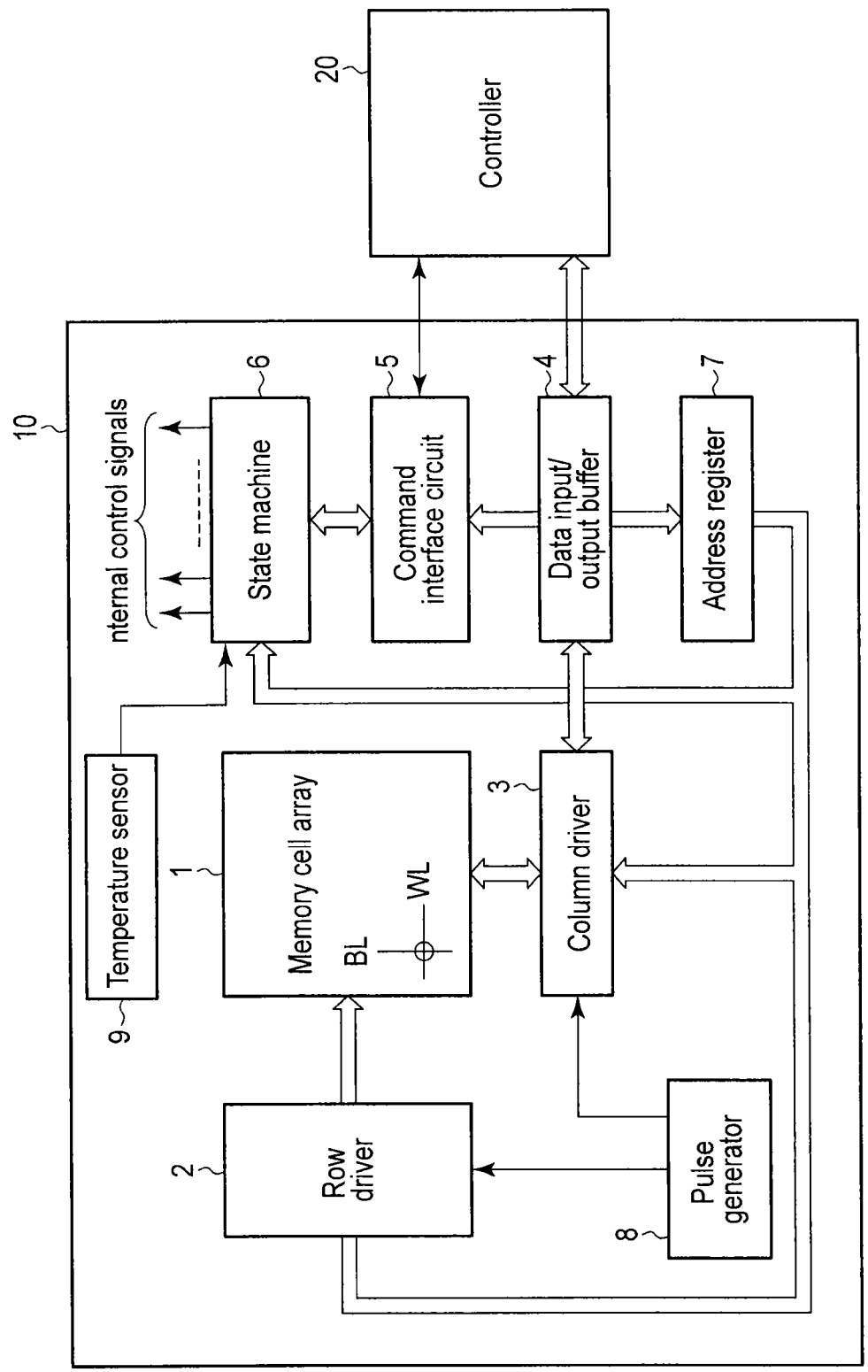
F I G. 31

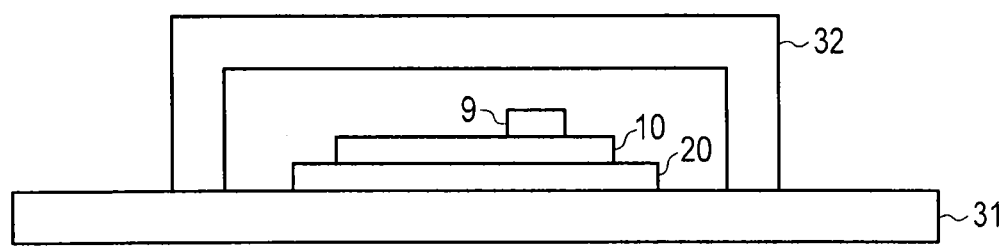
F I G. 32
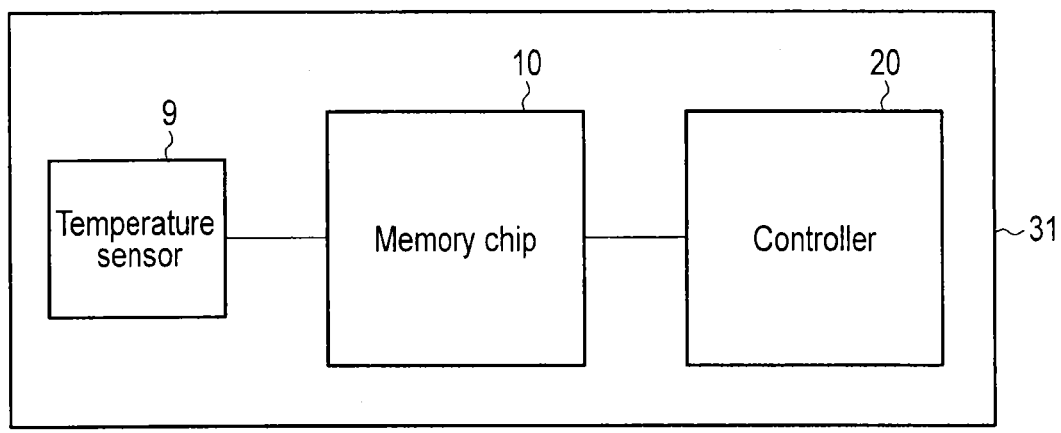
F I G. 33

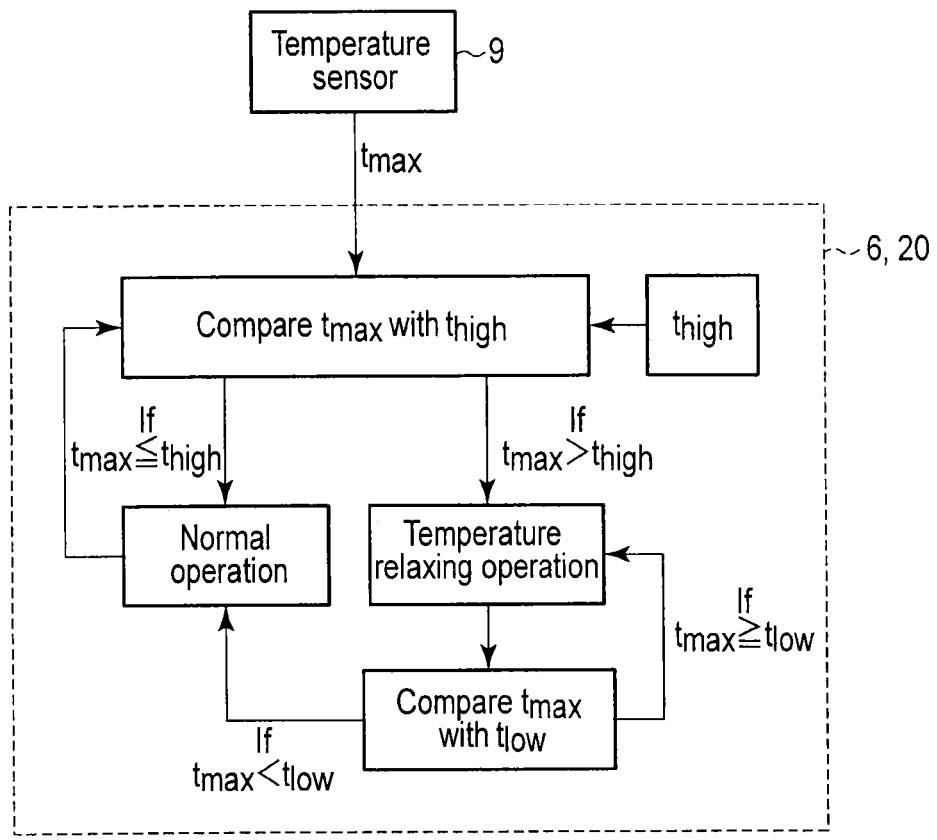
F I G. 34

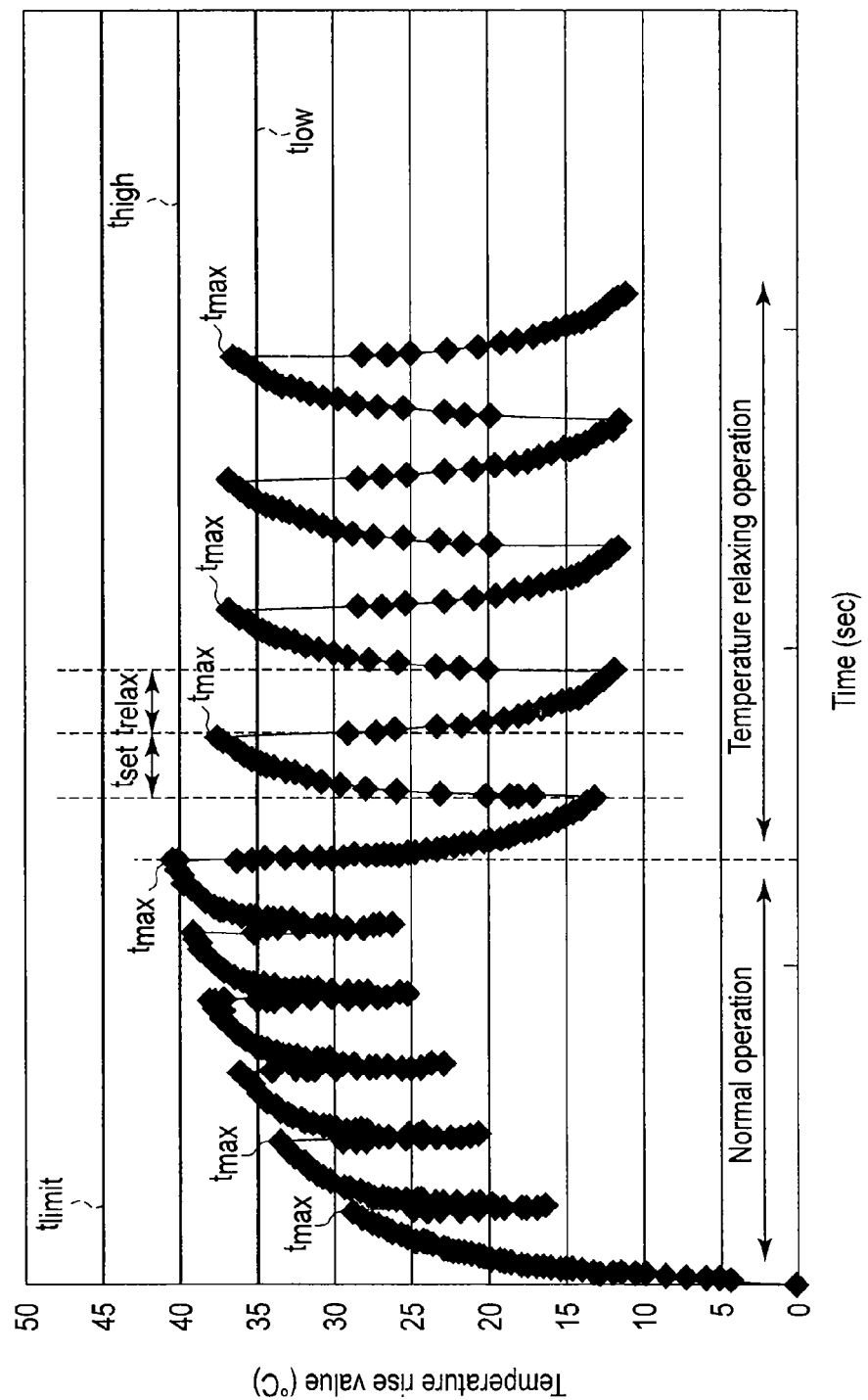
F I G. 35

US 8,717,840 B2

SEMICONDUCTOR MEMORY DEVICE AND METHOD OF CONTROLLING THE SAME

CROSS-REFERENCE TO RELATED APPLICATIONS

This application is based upon and claims the benefit of priority from Japanese Patent Application No. 2012-038567, filed Feb. 24, 2012, the entire contents of which are incorporated herein by reference.

FIELD

Embodiments described herein relate generally to a semiconductor memory device and a method of controlling the same.

BACKGROUND

The thermal engineering of a semiconductor memory device (chip) is an indispensable technique for accurately operating internal circuits. Especially in recent years, operation errors and device destruction caused by heat generated in three-dimensional multilayered memories such as a ReRAM (Resistive Random Access Memory), MRAM (Magnetic Random Access Memory), and BiCS (Bit Cost Scalable)-NAND pose problems.

Unfortunately, the conventional thermal engineering is to estimate a maximum temperature that can be generated in a semiconductor memory device being designed, based on the gross power consumption of the semiconductor memory device, and design circuits so that the maximum temperature does not exceed a tolerance. Since this method cannot design circuits by taking account of a local temperature distribution when a semiconductor memory device is actually operating, the method is insufficient as the thermal engineering of semiconductor memory devices.

BRIEF DESCRIPTION OF THE DRAWINGS

FIG. 1 is a view showing a basic arrangement;
FIG. 2 is a view showing a table concerning a temperature relaxation time;
FIG. 9 is a view showing selected block information about the positions of selected blocks;
FIGS. 10 and 11 are views showing selection inhibited regions;
FIGS. 12 and 13 are flowcharts showing the operation of the control portion;
FIGS. 15 and 16 are views showing examples of a memory cell array;
FIG. 20 is a view showing one cycle of a specific operation;
FIG. 21 is a view showing a write operation when the control portion is a state machine;
FIG. 22 is a view showing an erase/read operation when the control portion is a state machine;
FIG. 23 is a view showing a write operation when the control portion is a controller;
FIG. 24 is a view showing an erase/read operation when the control portion is a controller;
FIG. 26 is a view showing a modification of the one-cycle selected block count determination unit;
FIG. 28 is a view showing a table concerning minimum distance $R_{min}$;
FIG. 29 is a view showing a table concerning temperature relaxation time $t_{relax}$;
FIGS. 31 to 33 are views showing examples of a nonvolatile semiconductor memory including a temperature sensor;
FIG. 34 is a view showing an operation of switching a normal operation and temperature relaxing operation;
and
FIG. 35 is a view showing a method of switching the normal operation and temperature relaxing operation.

DETAILED DESCRIPTION

Figure 3:
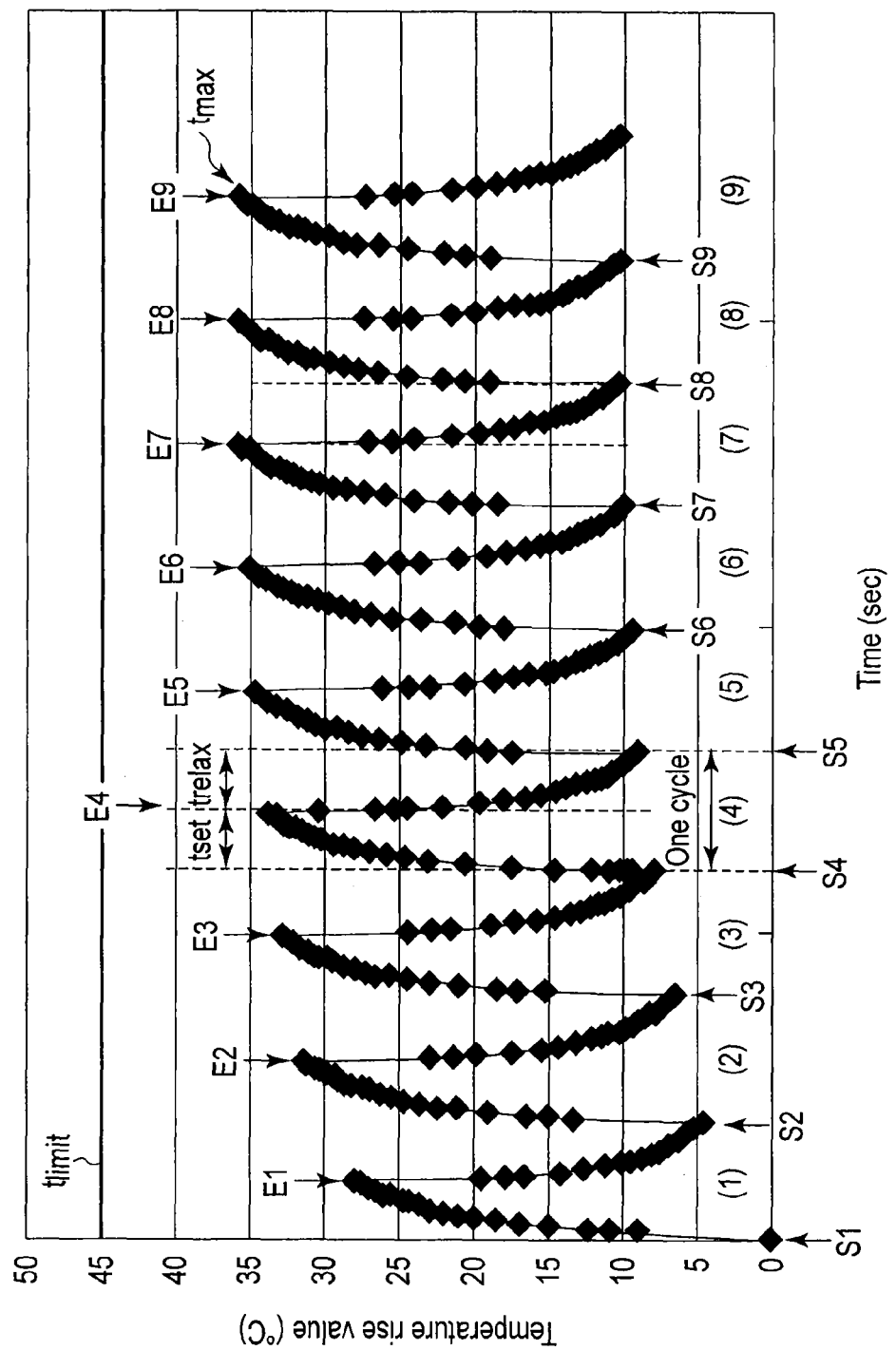
FIG. 3 is a view showing a method of obtaining the temperature relaxation time.

In general, according to one embodiment, a semiconductor memory device comprises: a memory cell array which includes blocks arranged in an n×m matrix (both n and m are natural numbers of not less than 2), and in which each of the blocks is capable of executing a write, read, or erase operation independently of other blocks; and a control portion which is configured to execute the write, read, or erase operation of a first block among the blocks in a first cycle; set a selection inhibited region within a range of a predetermined distance from the first block, until a temperature relaxation time for relaxing a temperature of the first block and a temperature around the first block which are raised by executing the first cycle has elapsed, set a region except the selection inhibited region among the blocks as a second block, and execute the write, read, or erase operation of the second block in a second cycle.

An embodiment will be explained below with reference to the accompanying drawings.

FIG. 1 shows the basic arrangement of a semiconductor memory device.

Memory cell array portion 11 includes blocks arranged in an n×m matrix. Note that both n and m are natural numbers of 2 or more. Date write/erase/read operations can be executed on each block independently of other blocks. Also, each block can have either a two-dimensional memory cell array or three-dimensional memory cell array.

Control portion 12 controls data write/erase/read operations for memory cell array portion 11. Control portion 12 includes storage portion 13 that stores, for each cycle of write/erase/read, a selected block (also called a block) as a write/erase/read target, and the temperature relaxation time of the selected block.

The temperature relaxation time is, when a specific operation is repetitively executed X cycles for one block, a cooling time from the end time of one specific operation to the start time of the next specific operation, which is required in order that the maximum value of the temperature of the block is always equal to or smaller than a tolerance.

Note that the temperature of one block has a maximum value when one cycle is completed, and this maximum value is equal to or smaller than the tolerance. Note also that X and the tolerance are fixed values determined in accordance with the specifications of a semiconductor memory device.

Driving portion 14 actually selects at least one block and executes a write/erase/read operation on a memory cell in the selected block in one cycle, under the control of control portion 12.

Note that memory cell array portion 11, control portion 12, and driving portion 14 can be formed in one chip (one semiconductor memory device) or in different chips.

FIG. 2 shows a table concerning the temperature relaxation time.

The temperature relaxation time takes different values in accordance with the types of specific operations (write/erase/read operations). In this embodiment, let $t_{relax-W}$ be the temperature relaxation time of a write operation, $t_{relax-E}$ be the temperature relaxation time of an erase operation, and $t_{relax-R}$ be the temperature relaxation time of a read operation.

Temperature relaxation times $t_{relax-W}$, $t_{relax-E}$, and $t_{relax-R}$ are prestored in storage portion 13 before a specific operation is started. For example, it is possible to always store temperature relaxation times $t_{relax-W}$, $t_{relax-E}$, and $t_{relax-R}$ as ROM data in storage portion 13, or store temperature relaxation times $t_{relax-W}$, $t_{relax-E}$, and $t_{relax-R}$ in storage portion 13 before a specific operation is started.

FIG. 3 is a view showing an example of a method of obtaining the temperature relaxation time.

This example is a case in which a specific operation is executed nine cycles for one block. The specific operation is a write operation, erase operation, or read operation.

Tolerance $t_{limit}$ of the temperature rise value of the semiconductor memory device is 45° C. The temperature rise value at start time S1 of the specific operation in the first cycle is 0° C., but the temperature rise values at start times S2, S3, . . . , S9 of the specific operation from the second cycle are not 0° C. because the heat storage of a preceding cycle exists. As the number of cycles increases, therefore, the minimum value (start time Si) and maximum value (end time Ei) of the temperature rise in one cycle gradually increase. Note that i is one of 1 to 9.

Accordingly, temperature relaxation time $t_{relax}$ of the specific operation is changed, and the minimum value of temperature relaxation time $t_{relax}$ at which maximum value $t_{max}$ of the temperature rise value of one block in which the specific operation is executed is always equal to or smaller than tolerance $t_{limit}$ of the temperature rise value even after the specific operation is continuously executed nine cycles is obtained. This minimum value is stored as temperature relaxation time $t_{relax}$ of the specific operation in storage portion 13 shown in FIG. 1.

Note that letting $t_{set}$ be an operation time from the start time to the end time of a specific operation, and $t_{relax}$ be the temperature relaxation time of the specific operation, the relationship between them is $$t_{relax} = K \times t_{set}$$

where K is a coefficient.

K is generally 1. Therefore, by setting temperature relaxation time $t_{relax}$ equivalent to operation time $t_{set}$ of a specific operation (e.g., $t_{set} = t_{relax} =$ about 10 msec), maximum value $t_{max}$ of the temperature rise value in one block in which the specific operation is executed is always equal to or smaller than tolerance $t_{limit}$ of the temperature rise value even after the specific operation is continuously executed nine cycles.

Temperature relaxation time $t_{relax}$ can be obtained by, e.g., executing a specific operation when a semiconductor memory device is tested.

It is also possible to, e.g., set $t_{relax} = t_{set}$, obtain $t_{relax}$ from $t_{set}$ whenever a specific operation is executed, and store the obtained value in storage portion 13 shown in FIG. 1. In this case, appropriate temperature relaxation time $t_{relax}$ can be obtained in accordance with the change in operation time $t_{set}$ of a specific operation. This makes it possible to increase the accuracy of temperature management in an actual operation.

Note that the case in which operation time $t_{set}$ of a specific operation changes is a case in which the specific operation (write/erase/read operation) is executed on a page as a unit smaller than a block as will be described later. In this case, the period of one cycle of the specific operation changes in accordance with the number of selected pages in a selected block.

Figures 4, 5:
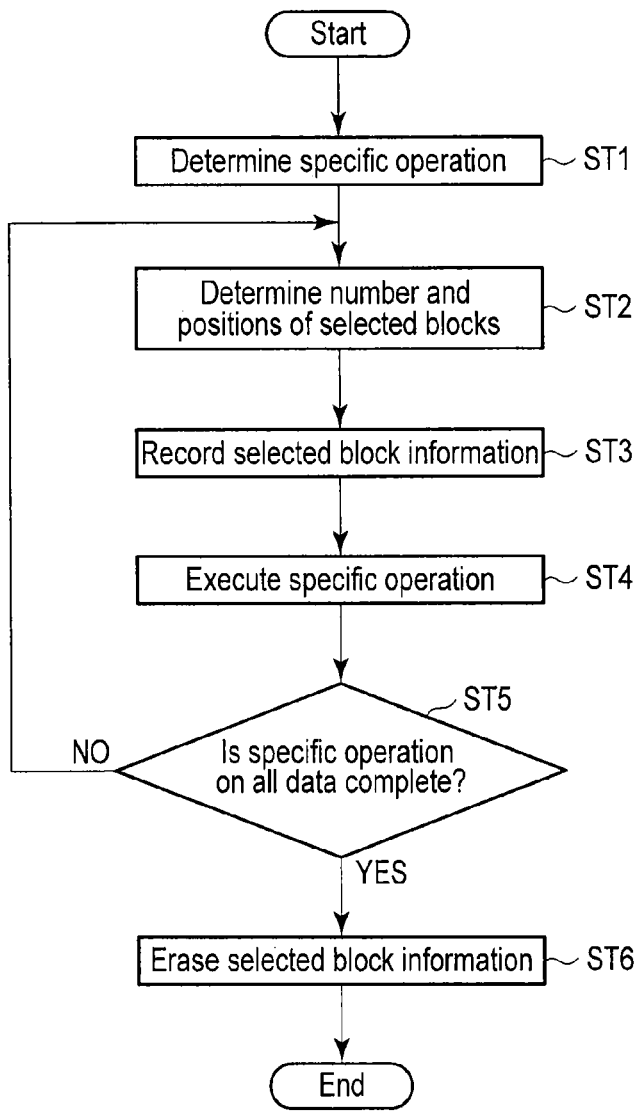
FIG. 4 is a flowchart showing the operation of a control portion.
FIG. 5 is a view showing a flag for specifying the type of a specific operation.

FIG. 4 shows the operation of control portion 12 shown in FIG. 1.

The feature of this operation is a thermal engineering technique by which the number and positions of selected blocks as targets of a specific operation are determined by taking account of a local temperature distribution when the semiconductor memory device is actually operating, so that the maximum value of the temperature of the semiconductor memory device is always equal to or smaller than the tolerance even after the specific operation is repeated more than one cycle.

First, a specific operation is determined (step ST1).

The determination of a specific operation can be executed by using a control signal (e.g., a write/erase/read enable signal) indicating an operation mode. When the specific operation is determined, a flag corresponding to an operation to be executed is changed from "L" to "H" as shown in FIG. 5. Flags other than the specific operation remain "L".

Then, the number and positions of blocks to be selected first (in the first cycle) are determined (step ST2).

The number and positions of selected blocks are determined under the condition (temperature condition) that maximum value $t_{max}$ of the temperature rise value of a block of interest does not exceed tolerance $t_{limit}$ due to heat generated in these selected blocks. The block of interest means a selected block when only one block is selected, and one of selected blocks, when two or more blocks are selected, which is a target of the determination of whether the block satisfies the above-described temperature condition.

Note that the number and positions of selected blocks in the first cycle can freely be determined from the blocks arranged in the n×m matrix shown in FIG. 1, and can also be selected from some templates prepared beforehand.

Figure 6:
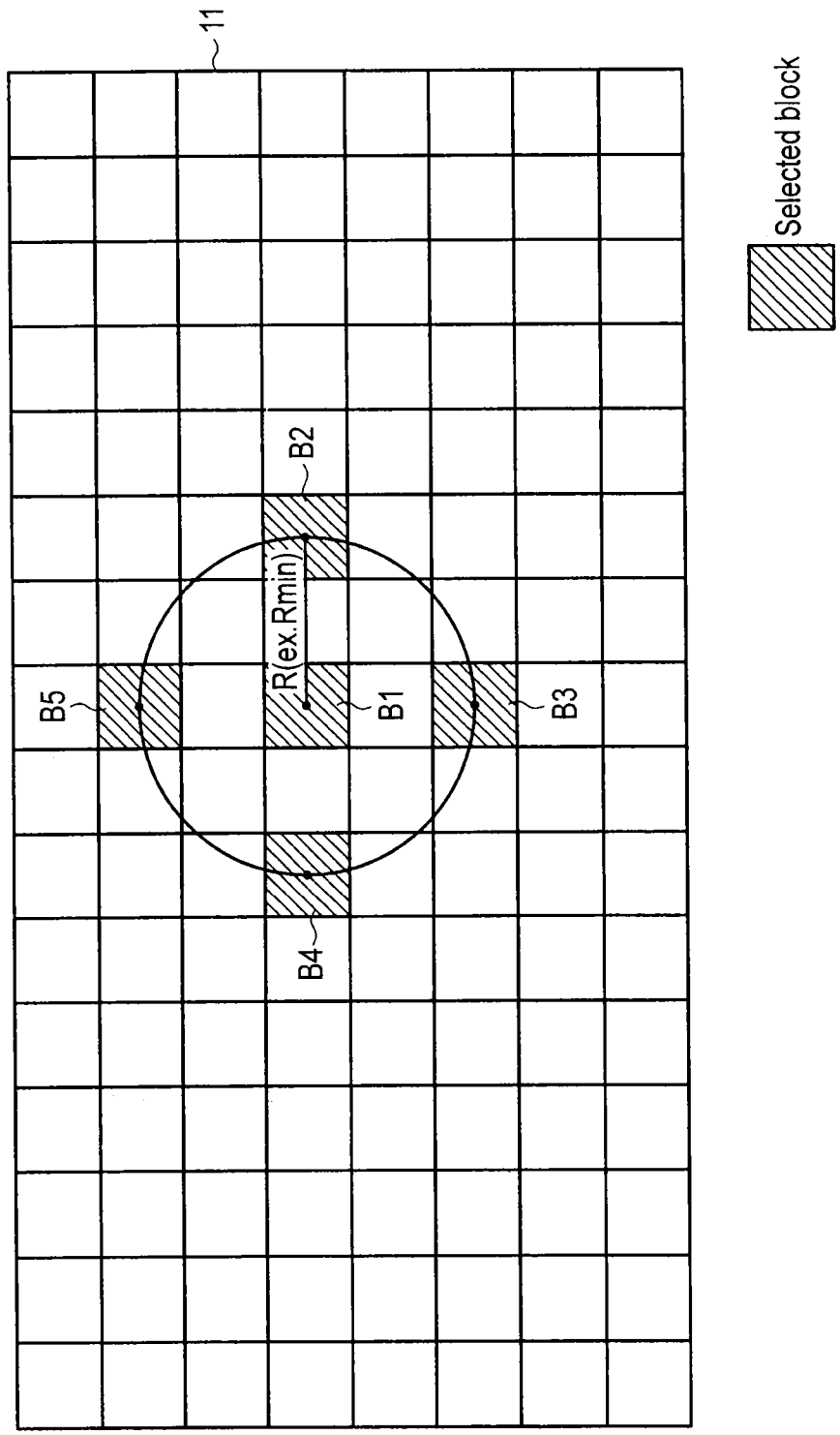
FIG. 6 is a view showing a pattern example of selected blocks.

For example, when freely determining the number and positions of selected blocks, block B1 is first selected as shown in FIG. 6. By regarding block B1 as a block of interest, additional blocks are selected under the condition that maximum value $t_{max}$ of the temperature rise value of block B1 does not exceed tolerance $t_{limit}$.

In this example, four blocks B2 to B5 at predetermined distance R from block B1 are selected as the additional blocks. Distance R is set at a value equal to or larger than minimum distance $R_{min}$ at which maximum value $t_{max}$ of the temperature rise value of block B1 as a block of interest does not exceed tolerance $t_{limit}$ due to heat generated in five selected blocks B1 to B5.

Figures 7, 8:
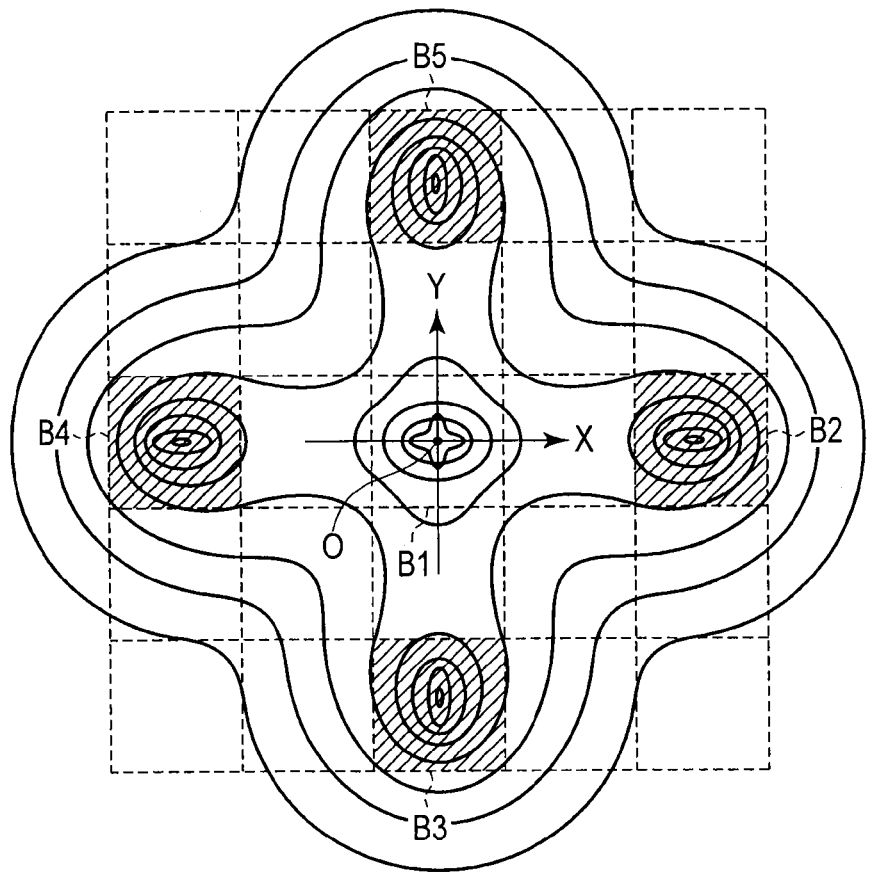
FIG. 7 is a view showing a chip temperature distribution obtained by simulation.
FIG. 8 is a view showing a table concerning minimum distance $R_{min}$.

As shown in FIG. 7, minimum distance $R_{min}$ is predetermined by simulation.

FIG. 7 shows the in-plane temperature distribution of memory cell array portion 11 shown in FIG. 1. Referring to FIG. 7, each dotted-line square represents a block.

The temperature rise values of selected blocks B1 to B5 can be represented by a normal distribution function. Accordingly, temperature rise value $t_{total}$ of block B1 as a block of interest can be obtained by superposing the normal distributions of selected blocks B1 to B5 as indicated by $$t_{total} = \sum_{i}^{n} \left( \frac{W_1}{d_1} C_0 \exp\left(-\frac{1}{2}\left(\frac{\Delta X_i^2}{\sigma_{0x}^2} + \frac{\Delta Y_i^2}{\sigma_{0y}^2}\right)\right) + \frac{W_1}{d_1} C_1 \exp\left(-\frac{1}{2}\left(\frac{\Delta X_i^2}{\sigma_{1x}^2} + \frac{\Delta Y_i^2}{\sigma_{1y}^2}\right)\right) \right) \quad (1)$$

In equation (1), i is the number (1 to n) of a block, and n is 5. Also, the gross heat amounts of blocks in a specific operation are the same, and W1 is the gross heat amount of one block. d1 is the thickness of the substrate of a semiconductor memory device (chip). $\Delta X_i$ and $\Delta Y_i$ are distances from central point O of block B1 as a block of interest to the central point of one of remaining blocks B2 to B5 in the two-dimensional coordinate system shown in FIG. 7. $C_0$, $C_1$, $\sigma_{0x}$, $\sigma_{0y}$, $\sigma_{1x}$, and $\sigma_{1y}$ are coefficients determined by the device structure, chip heat transfer coefficient, and the like.

As is apparent from equation (1), the temperature rise value of each of selected blocks B1 to B5 is proportional to the gross heat amount including heat generated by a leakage current generated in the selected block. Also, the temperature rise value of block B1 as a block of interest depends on, e.g., the structure, material, and package of the semiconductor memory device. Especially when the substrate (e.g., an Si substrate) of the semiconductor memory device is sufficiently thick, the temperature raise value of block B1 is inversely proportional to the thickness of the substrate.

Based on this equation, a temperature distribution when the distance from block B1 to blocks B2 to B5 is R is obtained, and whether maximum value $t_{max}$ of the temperature rise value of block B1 exceeds tolerance $t_{limit}$ is verified. Then, the minimum value of distance R at which maximum value $t_{max}$ of the temperature rise value of block B1 does not exceed tolerance $t_{limit}$ is regarded as minimum distance $R_{min}$.

As shown in FIG. 8, for example, minimum distance $R_{min}$ changes in accordance with the type of specific operation. Therefore, minimum distance $R_{min}$ is preobtained for each specific operation and stored in, e.g., storage portion 13 of control portion 12 shown in FIG. 1. For example, minimum distance $R_{min}$ is about 2 mm when the chip size is 18 mm×12 mm, the thickness of the substrate is 70 μm, the heat resistance value of the package is 120 k/W, the gross heat amount of each block in a specific operation is 0.3 W, and tolerance $t_{limit}$ is 45° C. Note that this value is corrected in accordance with, e.g., the specifications of the semiconductor memory device.

After selected block B1 is thus determined as a block of interest, additional blocks B2 to B5 are selected based on minimum distance $R_{min}$ stored in storage portion 13. Consequently, it is possible to select, e.g., five blocks B1 to B5 under the condition that maximum value $t_{max}$ of the temperature rise value of selected block B1 does not exceed tolerance $t_{limit}$.

When selecting the number and positions of selected blocks in the first cycle from prepared templates, all the templates are set, based on minimum distance $R_{min}$, to have the number and positions of selected blocks by which maximum value $t_{max}$ of the temperature rise value of the block of interest does not exceed tolerance $t_{limit}$.

Subsequently, selected block information is recorded (step ST3).

Blocks B1 to B5 selected in the first cycle are stored as selected block information in, e.g., storage portion 13 of control portion 12 shown in FIG. 1.

As shown in FIG. 9, the selected block information is, e.g., the block address of a selected block, and the block address is stored in storage portion 13. In this example, blocks selected in the first cycle are B1 to B5, so the block addresses of selected blocks B1 to B5 are stored in the column of cycle count=1.

Note that the selected block information can be recorded either during or after a specific operation to be explained below is executed.

Next, a specific operation is executed (step ST4).

This specific operation is executed in parallel with memory cells in selected blocks B1 to B5.

Then, whether the specific operation on all data is complete is determined (step ST5).

If the specific operation on all data is complete, the selected block information stored in storage portion 13 of control unit 12 shown in FIG. 1 is erased (reset), and this operation is terminated (step ST6).

In this example, the selected block information is erased after it is determined that the specific operation on all data is complete. However, the selected block information concerning a cycle in which the temperature relaxation time has elapsed may also be erased immediately after the temperature relaxation time has elapsed.

If the specific operation on all data is incomplete, the number and positions of blocks to be selected in the next cycle (second cycle) are determined (step ST2).

From the second cycle, the number and position of selected blocks are determined under the condition that maximum value $t_{max}$ of the temperature rise value of a block of interest does not exceed tolerance $t_{limit}$ due to heat generated in these selected blocks, in the same manner as in the first cycle.

Also, from the second cycle, selectable blocks are restricted by the selected block information and temperature relaxation time stored in storage portion 13 of control portion 12 shown in FIG. 1.

For example, when the start time of the second cycle is before temperature relaxation time $t_{relax}$ of blocks B1 to B5 selected in the first cycle has elapsed, a selection inhibited region (selection inhibited block) is set in the selection of blocks in the second cycle.

The selection inhibited block is a block having a central point within the range of a circle smaller than minimum distance $R_{min}$ from the central points of blocks B1 to B5 selected in the first cycle.

Figure 10:
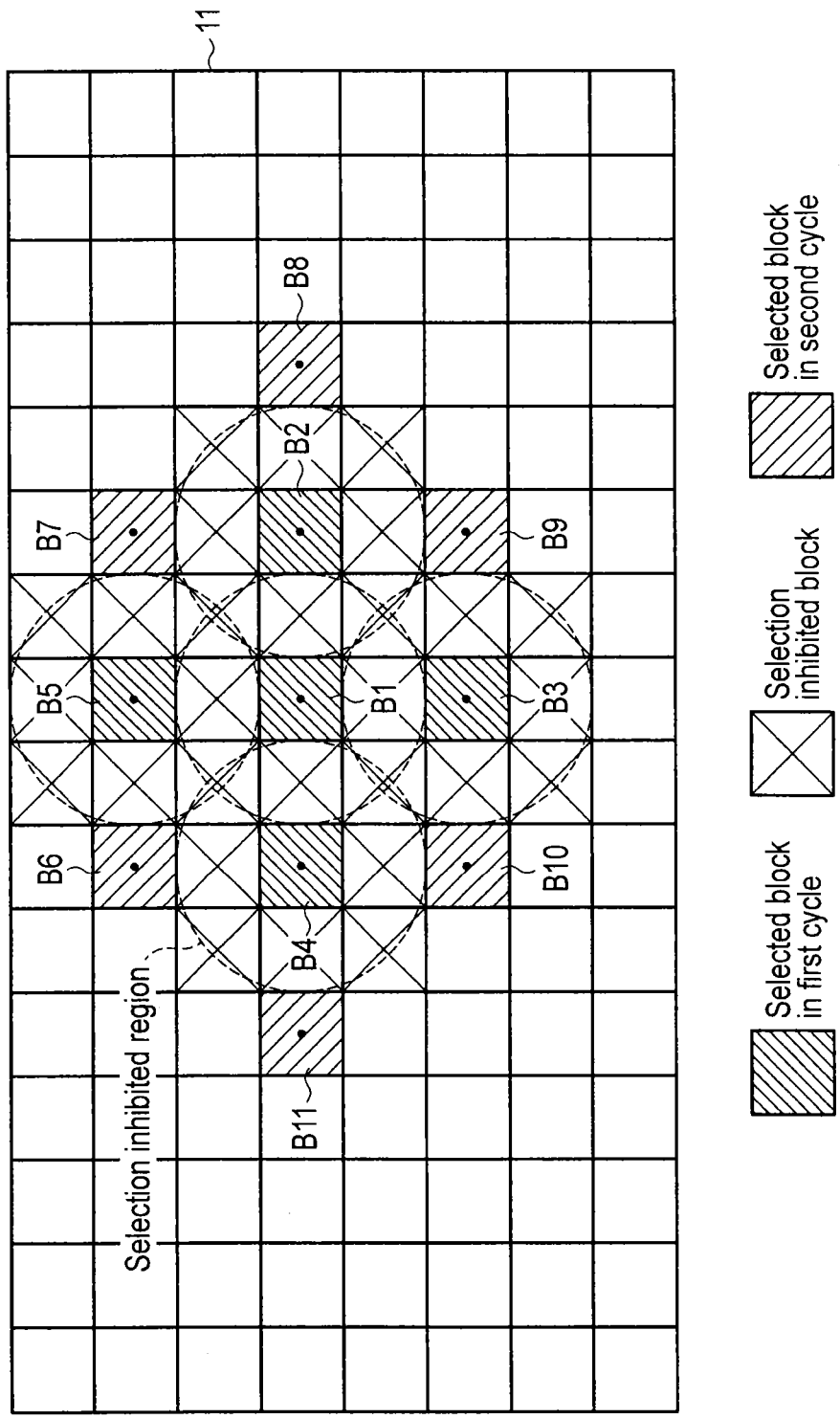

For example, as shown in FIG. 10, when blocks selected in the first cycle are B1 to B5, each block (mark X) having a central point within the range of a circle (dotted line) smaller than minimum distance $R_{min}$ from the central points of selected blocks B1 to B5 is set as a selection inhibited block.

This is so because if a block having a central point within the range of a circle smaller than minimum distance $R_{min}$ from the central points of blocks B1 to B5 selected in the first cycle is selected before temperature relaxation time $t_{relax}$ of selected blocks B1 to B5 has elapsed, maximum value $t_{max}$ of the temperature rise value of a block of interest may exceed tolerance $t_{limit}$.

In this example, therefore, six blocks B6 to B11 each having a central point at a distance equal to or larger than minimum distance $R_{min}$ from the central point of each of selected blocks B1 to B5 are selected in the second cycle.

Then, selected block information is recorded (step ST3).

As shown in FIG. 9, the selected block information is, e.g., the block address of a selected block, and the block address is stored in storage portion 13. In this example, blocks selected in the second cycle are B6 to B11, so the block addresses of selected blocks B6 to B11 are stored in the column of cycle count=2.

Next, the specific operation is executed (step ST4).

The specific operation is executed in parallel with memory cells in selected blocks B6 to B11.

Then, whether the specific operation on all data is complete is determined (step ST5).

If the specific operation on all data is complete, the selected block information stored in storage portion 13 of control unit 12 shown in FIG. 1 is erased (reset), and this operation is terminated (step ST6).

If the specific operation on all data is incomplete, the number and positions of blocks to be selected in the next cycle (third cycle) are determined (step ST2).

In the third cycle, selectable blocks are restricted by the selected block information and temperature relaxation time as in the second cycle.

For example, when the start time of the third cycle is before temperature relaxation time $t_{relax}$ of blocks B6 to B11 selected in the second cycle has elapsed, a selection inhibited region (selection inhibited block) is set in the selection of blocks in the third cycle.

Also, if the start time of the third cycle is even before temperature relaxation time $t_{relax}$ of blocks B1 to B5 selected in the first cycle has elapsed, the same selection inhibited region (selection inhibited block) as that in the second cycle is set in the third cycle as well.

In this example, an operation when the start time of the third cycle is after temperature relaxation time $t_{relax}$ of blocks B1 to B5 selected in the first cycle has elapsed will be explained.

In this case, the selection inhibited block is a block having a central point within the range of a circle smaller than minimum distance $R_{min}$ from the central points of blocks B6 to B11 selected in the second cycle.

For example, as shown in FIG. 11, when blocks selected in the second cycle are B6 to B11, each block (mark X) having a central point within the range of a circle (dotted line) smaller than minimum distance $R_{min}$ from the central points of selected blocks B6 to B11 is set as a selection inhibited block.

In this example, therefore, four blocks B12 to B15 each having a central point at a distance equal to or larger than minimum distance $R_{min}$ from the central point of each of selected blocks B6 to B11 are selected in the third cycle.

Then, selected block information is recorded (step ST3).

As shown in FIG. 9, the selected block information is, e.g., the block address of a selected block, and the block address is stored in storage portion 13. In this example, blocks selected in the third cycle are B12 to B15, so the block addresses of selected blocks B12 to B15 are stored in the column of cycle count=3.

Next, the specific operation is executed (step ST4).

The specific operation is executed in parallel with memory cells in selected blocks B12 to B15.

As described above, until a specific operation on all data is complete, the number and positions of selected blocks as targets of the specific operation are determined by taking account of a local temperature distribution when the semiconductor memory device is actually operating. This makes it possible to implement a thermal engineering technique by which the maximum value of the temperature rise value of the semiconductor memory device is always equal to or smaller than the tolerance even when the specific operation is repeated more than one cycle.

Note that in the above-described operation, the restriction imposed on selectable blocks from the second cycle as described above can be canceled by making the period of one cycle (e.g., the time from the start time of the first cycle to the start time of the second cycle) equal to or longer than temperature relaxation time $t_{relax}$. In this case, however, extending the period of one cycle prolongs the time required to complete a specific operation, so the characteristics of the semiconductor memory device deteriorate.

As described in this example, the speed of a specific operation (write/erase/read operation) can be increased by making the period of one cycle shorter than temperature relaxation time $t_{relax}$. In addition, by restricting selected blocks from the second cycle in accordance with the above-described condition, it is possible to prevent the temperature rise value of the semiconductor memory device from exceeding tolerance $t_{limit}$, thereby preventing deterioration of the reliability.

Figure 12:
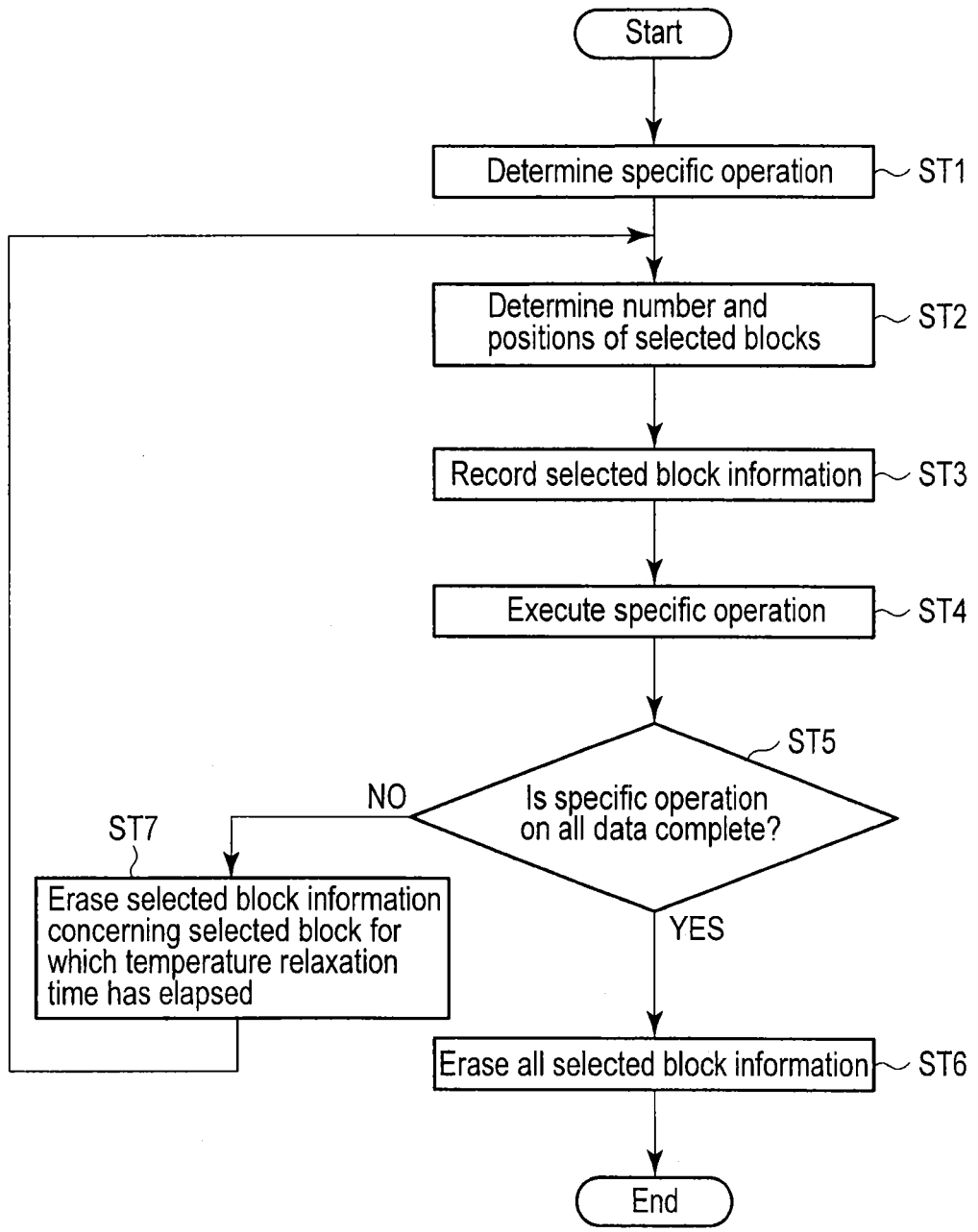

FIG. 12 shows the first modification of the operation shown in FIG. 4.

This modification has the feature that selected block information concerning a cycle for which the temperature relaxation time has elapsed is erased immediately after the temperature relaxation time has elapsed.

For example, if it is determined that a specific operation on all data is incomplete after one cycle is completed, selected block information concerning a cycle for which the temperature relaxation time has elapsed is erased (steps ST5 and ST7).

In this arrangement, the capacity of storage portion 13 for storing selected block information can be decreased because selected block information concerning a cycle for which the temperature relaxation time has elapsed is erased. This makes it possible to improve the performance of the control portion.

Note that if it is determined that the specific operation on all data is complete, all pieces of selected block information are erased (steps ST5 and ST6).

The rest of the operation (steps) is the same as the operation shown in FIG. 4, so a repetitive explanation will be omitted.

FIG. 13 shows the second modification of the operation shown in FIG. 4.

This modification has the feature that storage portion 13 shown in FIG. 1 stores not selected block information but information on a selection inhibited block (including a selected block) obtained from selected block information, i.e., selection inhibited block information.

In one cycle, selectable blocks are restricted based on selection inhibited blocks determined based on selected block information in previous cycles. Therefore, when selection inhibited blocks are preobtained and prestored in storage portion 13 in previous cycles, it is possible to omit the work of obtaining selection inhibited blocks in one cycle, and further increase the speed of a specific operation.

Also, in this modification, selection inhibited block information concerning a cycle for which the temperature relaxation time has elapsed is erased immediately after the temperature relaxation time has elapsed, as in the first modification.

For example, if it is determined that a specific operation on all data is incomplete after one cycle is completed, selected block information concerning a cycle for which the temperature relaxation time has elapsed is erased (steps ST5 and ST7).

Consequently, as in the first modification, it is possible to decrease the capacity of storage portion 13 for storing selection inhibited block information, and improve the performance of the control portion.

Note that if it is determined that the specific operation on all data is complete, all pieces of selection inhibited block information are erased (steps ST5 and ST6).

The rest of the operation (steps) is the same as the operation shown in FIG. 4, so a repetitive explanation will be omitted.

Figure 14:
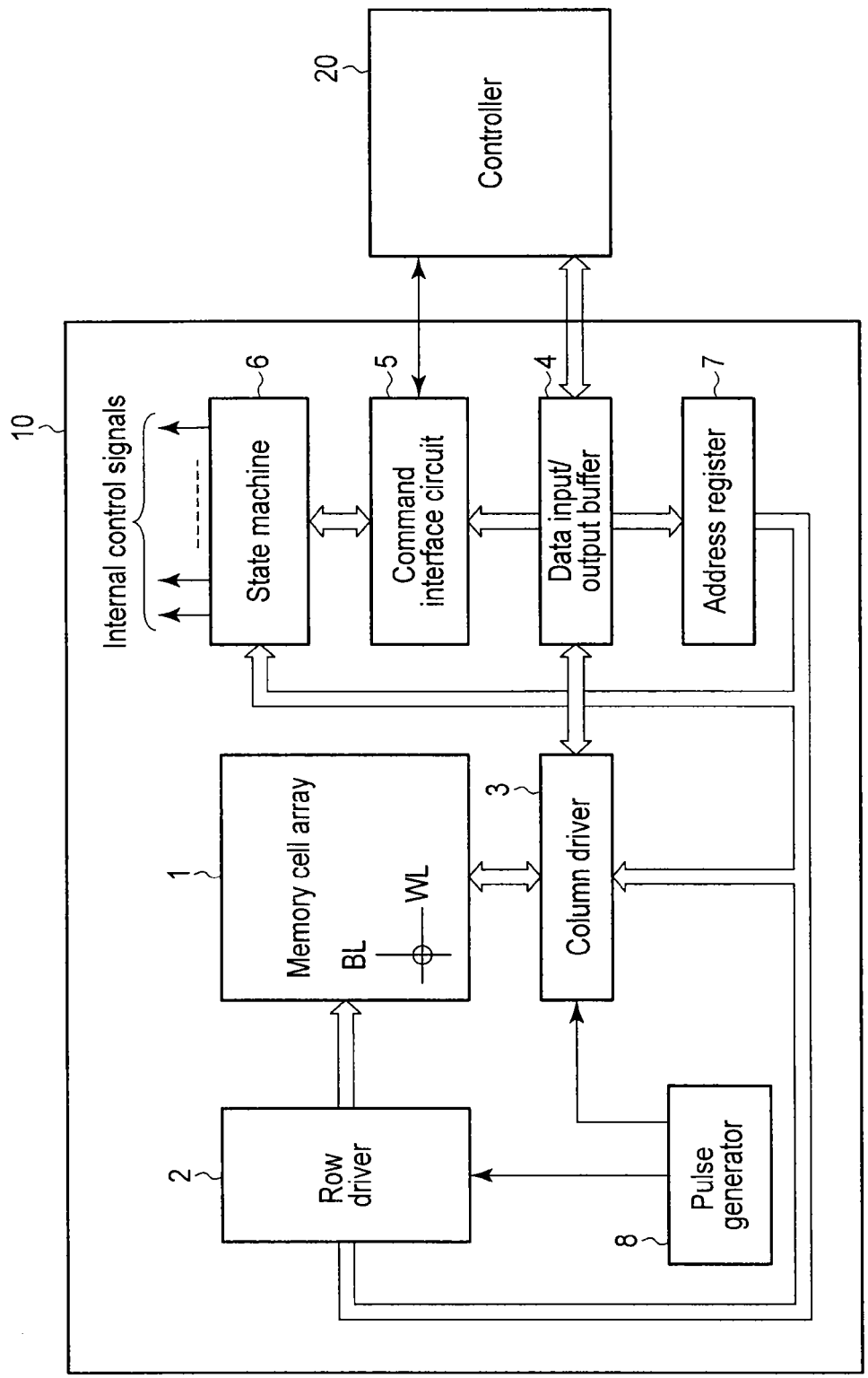
FIG. 14 is a view showing a nonvolatile semiconductor memory as an application example.

FIG. 14 shows a nonvolatile semiconductor memory as an application example.

It is effective to apply the basic arrangement shown in FIG. 1 to multilayered nonvolatile semiconductor memories such as a ReRAM (Resistive Random Access Memory), MRAM (Magnetic Random Access Memory), and BiCS (Bit Cost Scalable)-NAND. These memories are regarded as next-generation memories having the feature that the capacity is increased by a three-dimensional structure. To implement this, however, it is necessary to solve the problems of operation errors and device destruction caused by heat generated in a chip.

Nonvolatile semiconductor memory 10 and controller 20 are connected by a bus.

Memory cell array 1 corresponds to memory cell array 11 shown in FIG. 1, and includes blocks arranged in an n×m matrix. Note that both n and m are natural numbers of 2 or more. Memory cell array 1 includes word lines WL and bit lines BL intersecting each other. For example, one memory cell is formed at the intersection of word line WL and bit line BL.

Row driver 2 controls the potential of word line WL in memory cell array 1. Column driver 3 controls the potential of bit line BL in memory cell array 1. Row driver 2 and column driver 3 correspond to driving portion 14 shown in FIG. 1.

Data input/output buffer 4 is formed to execute input/output of write/read data with respect to controller 20. Data input/output buffer 4 also receives address data and command data from controller 20.

Command interface circuit 5 receives a control signal such as a write/erase/read enable signal from controller 20, and, based on the control signal, transfers command data input to data input/output buffer 4 to state machine 6.

State machine 6 manages the whole nonvolatile semiconductor memory 10. That is, state machine 6 manages the procedure of a specific operation (write/erase/read operation) based on the command data from controller 20.

Also, controller 20 determines the operation result of the specific operation by receiving status information managed by state machine 6.

Address register 7 temporarily holds address data, and transfers this address data to row driver 2 and column driver 3.

Pulse generator 8 generates a clock pulse for controlling the timing of a specific operation in nonvolatile semiconductor memory 10.

Control portion 12 shown in FIG. 1 can be formed in either nonvolatile semiconductor memory 10 or controller 20. When forming control portion 12 shown in FIG. 1 in nonvolatile semiconductor memory 10, the functions of control portion 12 shown in FIG. 1 can be embedded in state machine 6.

Figure 15:
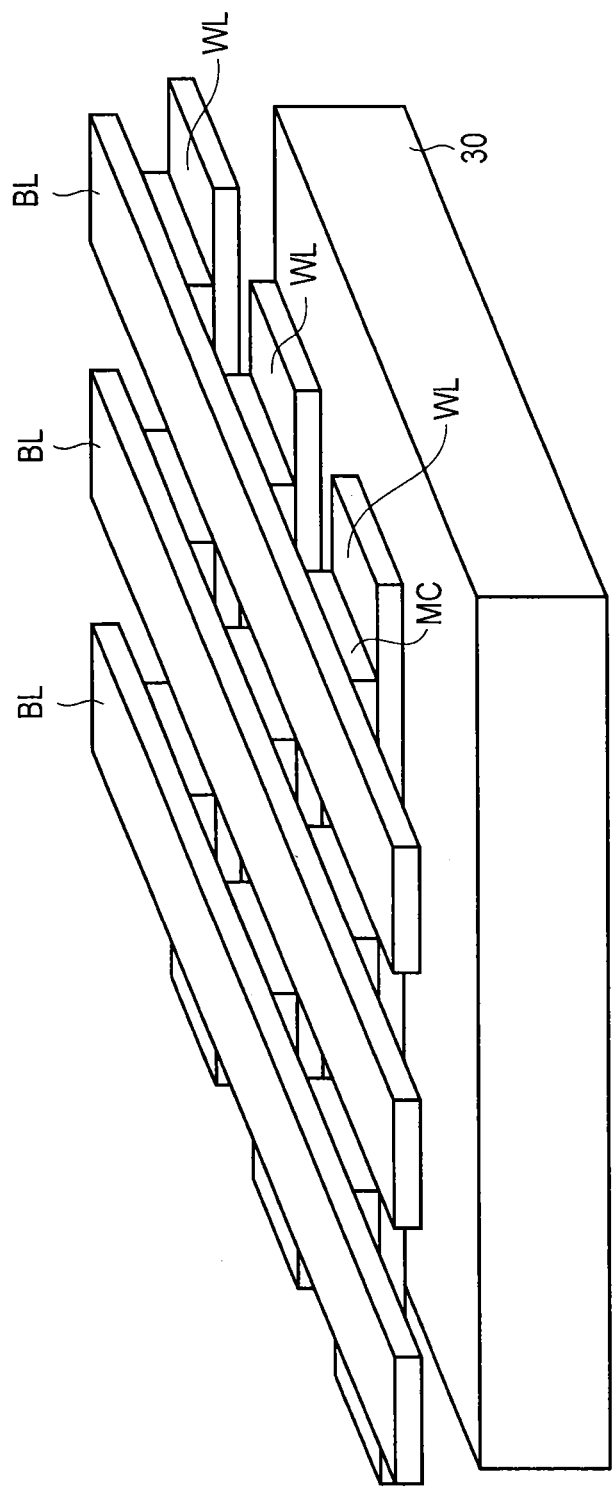

FIG. 15 shows an example of the memory cell array.

In this example, a memory cell is a resistance change memory (e.g., a ReRAM or MRAM) including a resistance change element.

Word lines WL and bit lines BL are arranged on semiconductor chip 30, and memory cells MC are arranged at the intersections of these lines. A memory cell array like this is called a cross point type memory cell array.

The cross point type memory cell array is advantageous for high integration because it is unnecessary to individually connect MOS transistors to memory cells MC. For example, as shown in FIG. 16, it is also possible to give a three-dimensional structure to the memory cell array by stacking memory cells MC.

Figure 17:
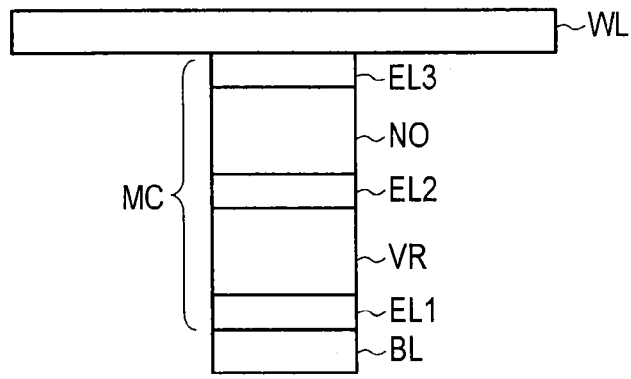
FIG. 17 is a view showing an example of a memory cell.

As shown in FIG. 17, for example, memory cell MC includes storage layer (resistance change element) VR, non-ohmic layer (rectifying element) NO, and electrode layers EL1, EL2, and EL3. The resistance value of storage layer VR can be controlled by the potentials of word line WL and bit line BL.

Memory cell MC stores one or more bits by controlling the resistance state of storage layer VR to two or more levels.

Figure 18:
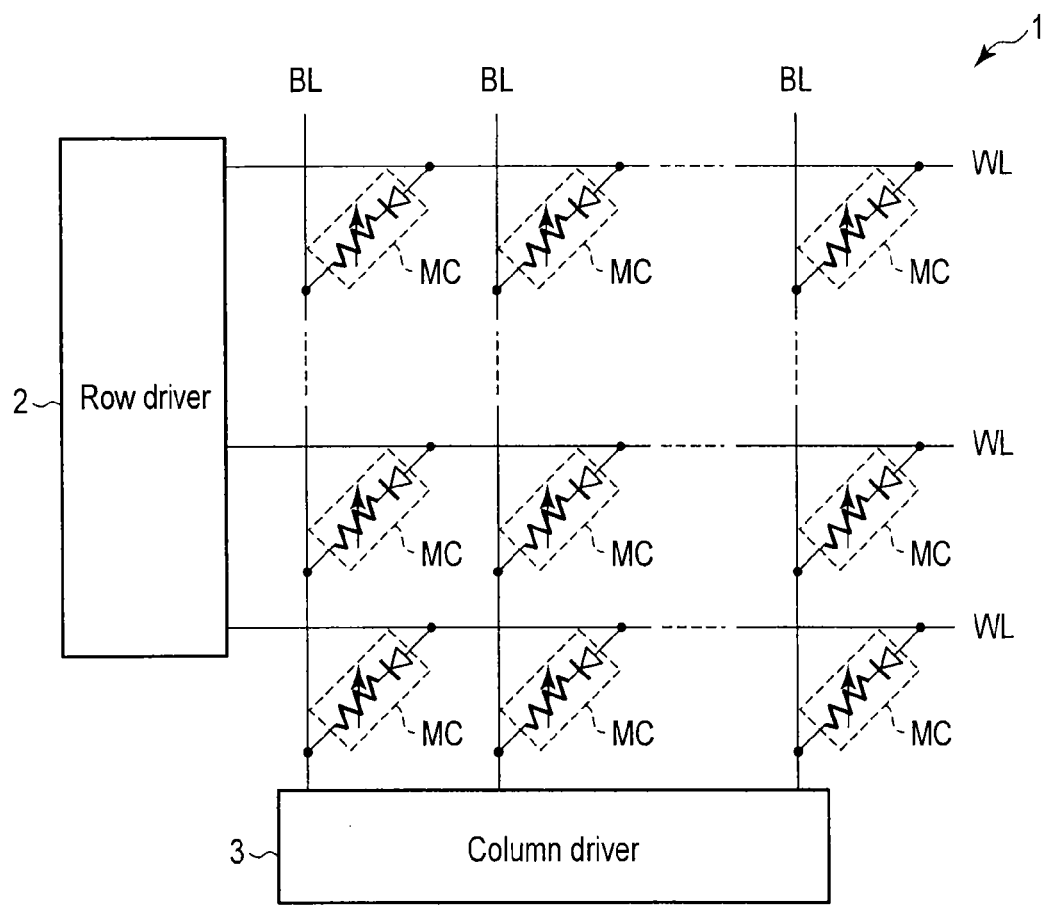
FIG. 18 is a view showing an equivalent circuit of the memory cell array.

FIG. 18 shows an equivalent circuit of the memory cell array shown in FIG. 15.

In this example, non-ohmic layer NO in memory cell MC is a diode. Specific operations (write/erase/read operations) can be executed by individually controlling the potentials of word line WL and bit line BL by row driver 2 and column driver 3.

Figure 19:
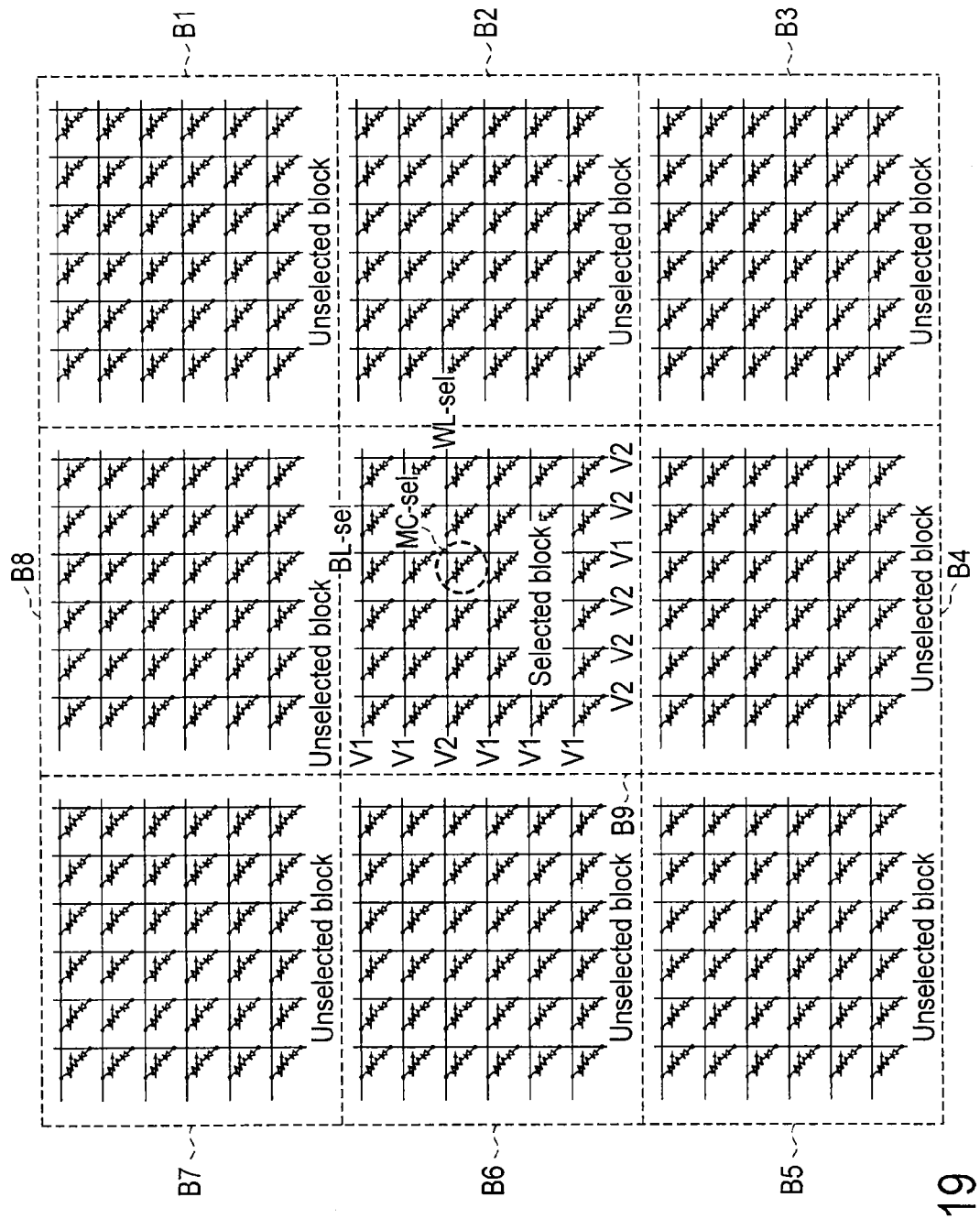
FIG. 19 is a view showing the voltage relationship of a selected block.

FIG. 19 shows an example in which the memory cell array shown in FIGS. 14 to 18 is divided into blocks in accordance with the basic arrangement shown in FIG. 1.

As an example, FIG. 19 shows nine blocks B1 to B9.

One block means a group of memory cells sharing word line WL and bit line BL. Specific operations (write/erase/read operations) can be executed on one block independently of other blocks.

The number of memory cells connected to one word line WL is, e.g., 8,000, and the number of memory cells connected to one bit line BL is, e.g., 2,000. In this case, the total number of memory cells in one block is 16,000,000.

A case in which block B9 is a selected block and a specific operation is executed on selected memory cell MC-sel in block B9 will be explained below. In this case, all word lines WL and all bit lines BL in unselected blocks B1 to B8 are set at, e.g., ground potential Vss.

In a write/erase operation, V1 (e.g., 3 V) is applied to selected word line WL-sel, and V2 (e.g., 0 V) is applied to selected bit line BL-sel. Also, V2 is applied to all word lines except selected word line WL-sel, and V1 is applied to all bit lines except selected bit line BL-sel.

In this state, a bias voltage (V1-V2) having the first polarity is applied to selected memory cell MC-sel, and data write/erase (high-resistance state→low-resistance state or low-resistance state→high-resistance state) is executed on selected memory cell MC-sel.

Note that write and erase can be controlled by changing the magnitude of the bias voltage to be applied to selected memory cell MC-sel (the value of an electric current flowing through the resistance change element), without changing the polarity of the bias voltage to be applied to selected memory cell MC-sel (monopolar operation).

Furthermore, while no bias voltage is applied to unselected memory cells connected to selected word line WL-sel and unselected memory cells connected to selected bit line BL-sel, a bias voltage (V2-V1) having the second polarity opposite to the first polarity is applied to unselected memory cells connected to both unselected word lines and unselected bit lines.

In unselected memory cells to which the bias voltage (V2-V1) having the second polarity is applied, the diodes as non-ohmic elements are set in a reverse bias state, so no data write/erase is executed on these unselected memory cells.

However, a leakage current is generated in an unselected memory cell because the reverse bias is applied to the diode in the unselected memory cell.

Assuming that the number of memory cells connected to one word line WL is 8,000 and the number of memory cells connected to one bit line BL is 2,000 as already described above, the number of unselected memory cells in which this leakage current is generated is 15,990,001. That is, a leakage current flows through almost all unselected memory cells in one block.

Especially in the cross point type resistance change memory as described above, a leakage current flowing through unselected memory cells increases in addition to an electric current flowing through selected memory cell MC-sel, a temperature rise in the selected block of the chip poses a problem.

In a read operation, V1 (e.g., 1 V) is applied to selected word line WL-sel, and V2 (e.g., 0 V) is applied to selected bit line BL-sel. Also, V2 is applied to all word lines except selected word line WL-sel, and V1 is applied to all bit lines except selected bit line BL-sel.

In the read operation, a write/erase error is prevented by making the value of V1 much smaller than that of V1 in the write/erase operation.

An embodiment in which the operation shown in FIG. 4, 12, or 13 is executed in the application example shown in FIGS. 14, 15, 16, 17, 18, and 19 will be explained below.

In the nonvolatile semiconductor memory according to the application example shown in FIGS. 14, 15, 16, 17, 18, and 19, the write operation and read operation are executed for each group of memory cells connected to one word line WL (i.e., for each page). Also, the erase operation is executed for each page or each block.

When performing a specific operation (write/erase/read operation) for each page, one cycle of the specific operation explained so far includes specific operations for pages (selected pages) in a selected block.

For example, as shown in FIG. 20, one cycle of a specific operation in a selected block includes an operation of sequentially selecting pages.

First, selected pages as targets of write/erase/read are determined (step ST1). Then, page write/page erase/page read is executed for one of the selected pages (step ST2).

After that, whether write/erase/read on all the selected pages is complete is determined. If write/erase/read on all the selected pages is complete, the specific operation is terminated (step ST3).

If write/erase/read on all the selected pages is incomplete, the selected pages are shifted (steps ST3 and ST4), and page write/page erase/page read is executed for one of the selected pages again (step ST2).

As described above, this example is based on the premise that one cycle of a specific operation includes specific operations for pages (selected pages) in a selected block. In this case, as already described previously, the temperature relaxation time of the specific operation is desirably obtained for each cycle from the operation time of the specific operation, so a case like this will be explained below.

Note that this case does not exclude, e.g., a method in which the temperature relaxation time of a specific operation is prestored as a fixed value in the storage portion.

FIGS. 21 and 22 show an embodiment in which a function of performing the operation shown in FIG. 4, 12, or 13 is added to state machine 6 of nonvolatile semiconductor memory 10.

State machine 6 includes selected block total number determination portion 6-1 for determining the total number of selected blocks required for write/erase/read of all data, information storage portion 6-2 for storing information such as the selected block information and temperature relaxation time, one-cycle selected block count determination portion 6-3 for determining the number of selected blocks in one cycle, and logical/physical address converter 6-4 for associating the logical and physical addresses of data as a target of write/erase/read.

Note that FIG. 21 shows the flow of data in the write operation, and FIG. 22 shows the flow of data in the erase/read operation.

First, the write operation will be explained with reference to FIG. 21.

When controller 20 shown in FIG. 14 instructs nonvolatile semiconductor memory 10 to perform the write operation, information on write data is input to selected block total number determination portion 6-1 via data input/output buffer 4. Based on this information on the write data, selected block total number determination portion 6-1 determines the total number of selected blocks necessary to write all data.

Also, one-cycle selected block count determination portion 6-3 determines the number of selected blocks in one cycle, based on the total number of selected blocks, and the selected block information and temperature relaxation time from information recording portion 6-2.

Figure 25:
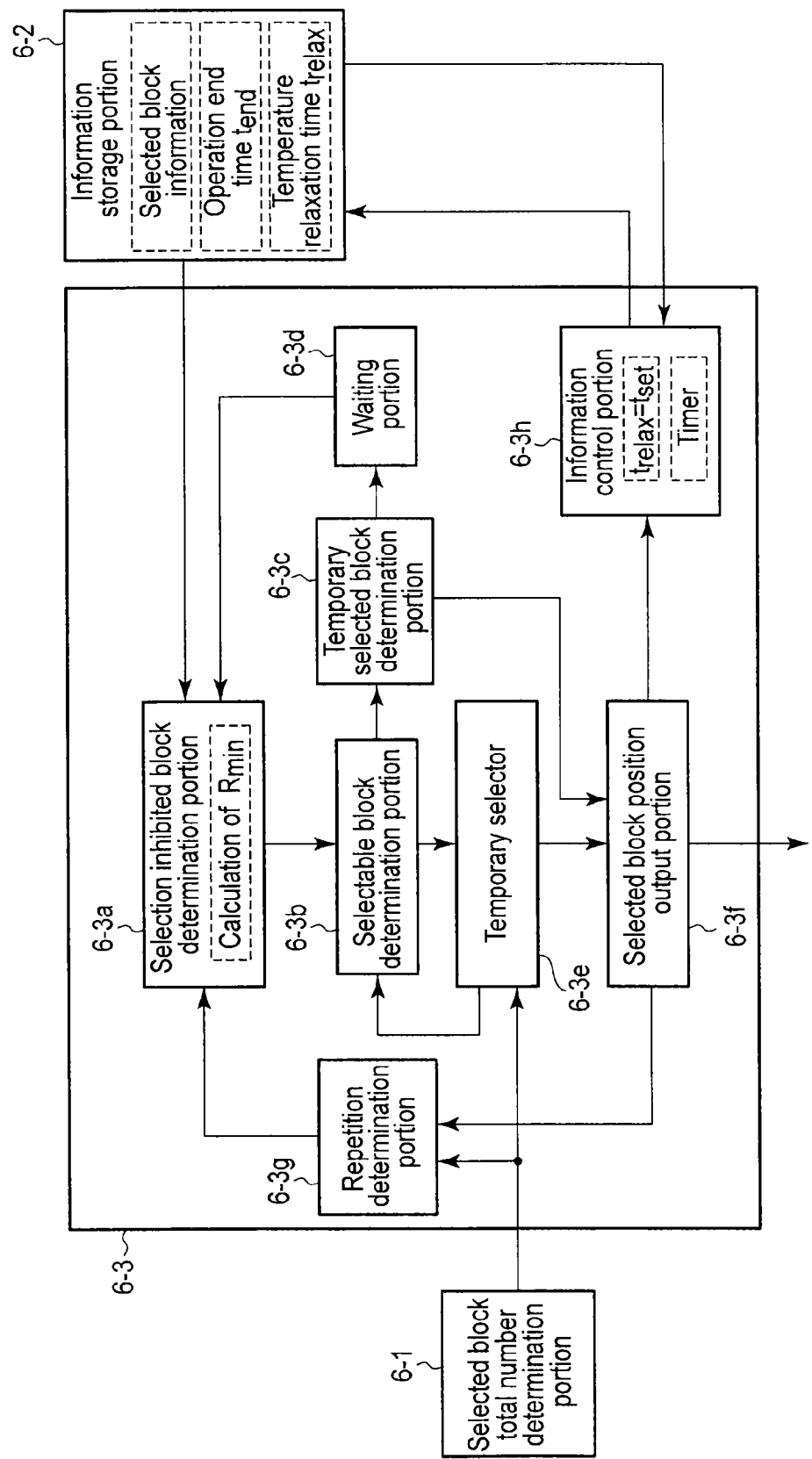
FIG. 25 is a view showing details of a one-cycle selected block count determination unit.

One-cycle selected block count determination portion 6-3 has, e.g., an arrangement shown in FIG. 25.

Selection inhibited block determination portion 6-3a determines a selection inhibited block not to be selected, based on the selected block information indicating blocks selected in the past from information recording portion 6-2, so that the temperature rise value of the chip does not exceed tolerance $t_{limit}$.

This selection inhibited block can be a block within the range of minimum distance $R_{min}$ from the centers of the blocks selected in the past. Minimum distance $R_{min}$ can be calculated by selection inhibited block determination portion 6-3a based on equation (1) described earlier, and can also be selected from a lookup table as shown in FIG. 8.

Based on the selection inhibited blocks, selectable block determination portion 6-3b determines blocks selectable in one cycle of a specific operation to be executed. If no selectable block exists, selectable block determination portion 6-3b instructs temporary selected block determination portion 6-3c to determine whether a temporary selected block exists.

If no temporary selected block exists, temporary selected block determination portion 6-3c instructs waiting portion 6-3d to wait for a predetermined period.

After waiting for the predetermined period, waiting portion 6-3d instructs selection inhibited block determination portion 6-3a to determine a selection inhibited block again.

On the other hand, the selected block information stored in information recording portion 6-2 changes with time. For example, information control portion 6-3h stores, in information storage portion 6-2, a block selected in the past, operation end time $t_{end}$ of the write operation in the selected block, and temperature relaxation time $t_{relax}$ of the selected block. Also, information control portion 6-3h includes, e.g., a timer, and erases, from information storage portion 6-2, information on a selected block for which temperature relaxation time $t_{relax}$ has elapsed from operation end time $t_{end}$ of the write operation.

Accordingly, if neither a selectable block nor a temporary selected block exists, waiting portion 6-3d forms a predetermined waiting period. Consequently, a selectable block always exists when selection inhibited block determination portion 6-3a determines a selection inhibited block again.

Furthermore, if no selectable block exists and a temporary selected block exists, temporary selected block determination portion 6-3c sets the temporary selected block as a finally determined selected block without issuing any waiting instruction to waiting portion 6-3d. In addition, temporary selected block determination portion 6-3c instructs selected block position output portion 6-3f to output the position of the finally determined selected block.

At this point of time, the number of selected blocks has not reached the total number of selected blocks necessary for write of all data.

Accordingly, repetition determination portion 6-3g determines whether the sum of the blocks selected so far has reached the total number of selected blocks. If the sum of the selected blocks has not reached the total number of selected blocks, repetition determination portion 6-3g instructs selection inhibited block determination portion 6-3a to determine a selection inhibited block again.

Thus, whether to perform the next cycle is determined based on the instructions from repetition determination portion 6-3g.

If a selectable block exists, selectable block determination portion 6-3b notifies temporary selector 6-3e of the selectable block.

Temporary selector 6-3e determines the number and positions of temporary selected blocks based on the selected block total number from selected block total number determination portion 6-1 and the selectable block from selectable block determination portion 6-3b.

If the number of selectable blocks is larger than the selected block total number, all blocks required to write all data are selectable, so temporary selector 6-3e selects all these blocks and instructs selected block position output portion 6-3f to output position information of the selected blocks.

At this point of time, the sum of the selected blocks has reached the selected block total number, so repetition determination portion 6-3e does not instruct selection inhibited block determination portion 6-3a to determine a selection inhibited block again.

If the number of selectable blocks is smaller than the selected block total number, not all blocks necessary to write all data are selectable, so temporary selector 6-3e determines one or more temporary selected blocks, and instructs selectable block determination portion 6-3b to determine whether a selectable block exists.

In accordance with this instruction from temporary selector 6-3e, selectable block determination portion 6-3b determines a selectable block again based on the selection inhibited block.

Information control portion 6-3h stores, in information storage portion 6-2, the blocks selected in one cycle, and operation end time $t_{end}$ of the write operation in the selected blocks, and temperature relaxation time $t_{relax}$ of the selected blocks.

In this step, information control portion 6-3f stores, e.g., temperature relaxation time $t_{relax}$ equal to operation time $t_{set}$ of the specific operation (write operation), in information storage portion 6-2.

Also, as already described above, information control portion 6-3f manages temperature relaxation time $t_{relax}$, and erases, from information storage portion 6-2, information on a selected block for which temperature relaxation time $t_{relax}$ has elapsed from operation end time $t_{end}$ of the write operation.

Note that whether temperature relaxation time $t_{relax}$ has elapsed is desirably periodically determined at a predetermined interval shorter than temperature relaxation time $t_{relax}$.

Logical/physical address converter 6-4 is notified, for each cycle, of the selected blocks determined by one-cycle selected block count determination unit 6-3.

Logical/physical address converter 6-4 associates the logical and physical addresses of data as a write target.

The physical address of the data as a write target is temporarily held in address register 7. Based on this physical address held in address register 7, row driver 2 and column driver 3 select a memory cell in the selected block.

This allows to execute the write operation.

Next, the erase/read operation will be explained with reference to FIG. 22.

When controller 20 shown in FIG. 14 instructs nonvolatile semiconductor memory 10 to perform the erase/read operation, information on erase/read data is input to selected block total number determination portion 6-1 via data input/output buffer 4.

Based on this information on the erase/read data, logical/physical address converter 6-4 associates the logical and physical addresses, and determines a selected block as an erase/read target.

Based on this selected block determined by logical/physical address converter 6-4, selected block total number determination portion 6-1 determines the total number of selected blocks required to erase/read all data.

Also, one-cycle selected block count determination portion 6-3 determines the number of selected blocks in one cycle, based on the total number of selected blocks, and the selected block information and temperature relaxation time from information recording portion 6-2.

One-cycle selected block number determination portion 6-3 has, e.g., the same arrangement as that for the write operation shown in FIG. 25. The erase/read operation of one-cycle selected block count determination portion 6-3 shown in FIG. 25 is the same as the write operation, so a repetitive explanation will be omitted.

The physical address of the selected block determined by one-cycle selected block count determination portion 6-3 is temporarily held in address register 7 for each cycle.

Based on this physical address held in address register 7, row driver 2 and column driver 3 select a memory cell in the selected block.

This allows to execute the erase/read operation.

FIGS. 23 and 24 show an embodiment in which a function of performing the operation shown in FIG. 4, 12, or 13 is added to controller 20 for controlling nonvolatile semiconductor memory 10.

Controller 20 includes selected block total number determination portion 6-1 for determining the total number of selected blocks required for write/erase/read of all data, information storage portion 6-2 for storing information such as the selected block information and temperature relaxation time, one-cycle selected block count determination portion 6-3 for determining the number of selected blocks in one cycle, and logical/physical address converter 6-4 for associating the logical and physical addresses of data as a target of write/erase/read.

Note that FIG. 23 shows the flow of data in the write operation, and FIG. 24 shows the flow of data in the erase/read operation.

First, the write operation will be explained with reference to FIG. 23.

Based on information on write data, selected block total number determination portion 6-1 determines the total number of selected blocks necessary to write all data. Also, one-cycle selected block count determination portion 6-3 determines the number of selected blocks in one cycle, based on the total number of selected blocks, and the selected block information and temperature relaxation time from information recording portion 6-2.

One-cycle selected block count determination portion 6-3 has, e.g., the arrangement shown in FIG. 25. Since the operation of one-cycle selected block count determination portion 6-3 shown in FIG. 25 has already been described, a repetitive explanation will be omitted.

Logical/physical address converter 6-4 is notified, for each cycle, of the selected block determined by one-cycle selected block count determination unit 6-3.

Logical/physical address converter 6-4 associates the logical and physical addresses of data as a write target.

The physical address of the data as a write target is transferred to nonvolatile semiconductor memory 10. Based on this physical address from controller 20, nonvolatile semiconductor memory 10 selects a memory cell in the selected block.

This allows to execute the write operation.

Next, the erase/read operation will be explained with reference to FIG. 24.

Based on information on erase/read data, logical/physical address converter 6-4 associates the logical and physical addresses, and determines a selected block as an erase/read target.

Based on this selected block determined by logical/physical address converter 6-4, selected block total number determination portion 6-1 determines the total number of selected blocks required to erase/read all data.

Also, one-cycle selected block count determination portion 6-3 determines the number of selected blocks in one cycle, based on the total number of selected blocks, and the selected block information and temperature relaxation time from information recording portion 6-2.

One-cycle selected block number determination portion 6-3 has, e.g., the arrangement shown in FIG. 25. Since the operation of one-cycle selected block count determination portion 6-3 shown in FIG. 25 has already been described, a repetitive explanation will be omitted.

The physical address of the selected block determined by one-cycle selected block count determination portion 6-3 is transferred to nonvolatile semiconductor memory 10 for each cycle. Based on this physical address from controller 20, nonvolatile semiconductor memory 10 selects a memory cell in the selected block.

This allows to execute the erase/read operation.

FIG. 26 shows the first modification of the write/erase/read operations explained with reference to FIGS. 21, 22, 23, 24, and 25.

This modification has the feature that information storage portion 6-2 stores selected block templates, an $R_{min}$ lookup table, and a $t_{relax}$ lookup table.

Figure 27:
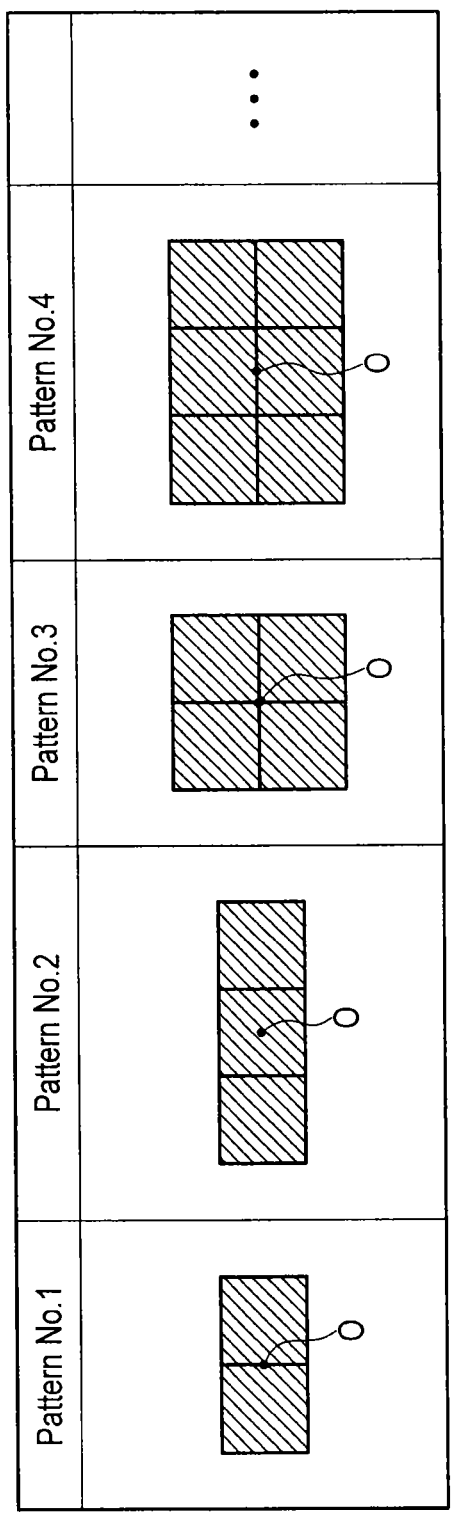
FIG. 27 is a view showing templates of selected blocks.

As shown in FIG. 27, for example, the selected block template is a predetermined pattern of blocks selectable in one cycle. Although FIG. 27 shows only four templates in this modification, it is also possible to use, as a template, another pattern such as a pattern in which selected blocks are spaced apart from each other.

In an actual memory operation, selected blocks are desirably arranged adjacent to each other in some cases during write/erase. If this is the case, as shown in FIG. 27, it is effective to preregister patterns containing adjacent blocks as templates.

As shown in FIG. 28, for example, the $R_{min}$ lookup table is a table predefining minimum distances $R_{min}$ corresponding to the templates shown in FIG. 27. Minimum distance $R_{min}$ is determined based on central point O of blocks forming one template. Also, minimum distance $R_{min}$ is desirably predetermined by simulation based on equation (1) described above.

As shown in FIG. 29, for example, the t relax lookup table is a table predefining temperature relaxation time $t_{relax}$ corresponding to the templates shown in FIG. 27 and operation time $t_{set}$ of a specific operation. In this case, temperature relaxation time $t_{relax}$ changes in accordance with the type of template and operation time $t_{set}$ of the specific operation.

In an actual memory operation as already described, operation time $t_{set}$ of a specific operation in one cycle sometimes changes when performing write/erase/read for each page. In a case like this, it is effective to preregister the $t_{relax}$ lookup table as shown in FIG. 29.

Also, temperature relaxation time t relax corresponding to the type of template and operation time $t_{set}$ of a specific operation are desirably predetermined by simulation based on equation (1) described previously, when designing the device or performing a test operation.

The operation of one-cycle selected block count determination portion 6-3 in this modification will be explained below.

Selection inhibited block determination unit 6-3a determines a selection inhibited block not to be selected, based on selected block information obtained from information recording portion 6-2 and indicating blocks selected in the past, so that the temperature rise value of the chip does not exceed tolerance $t_{limit}$.

Figure 30:
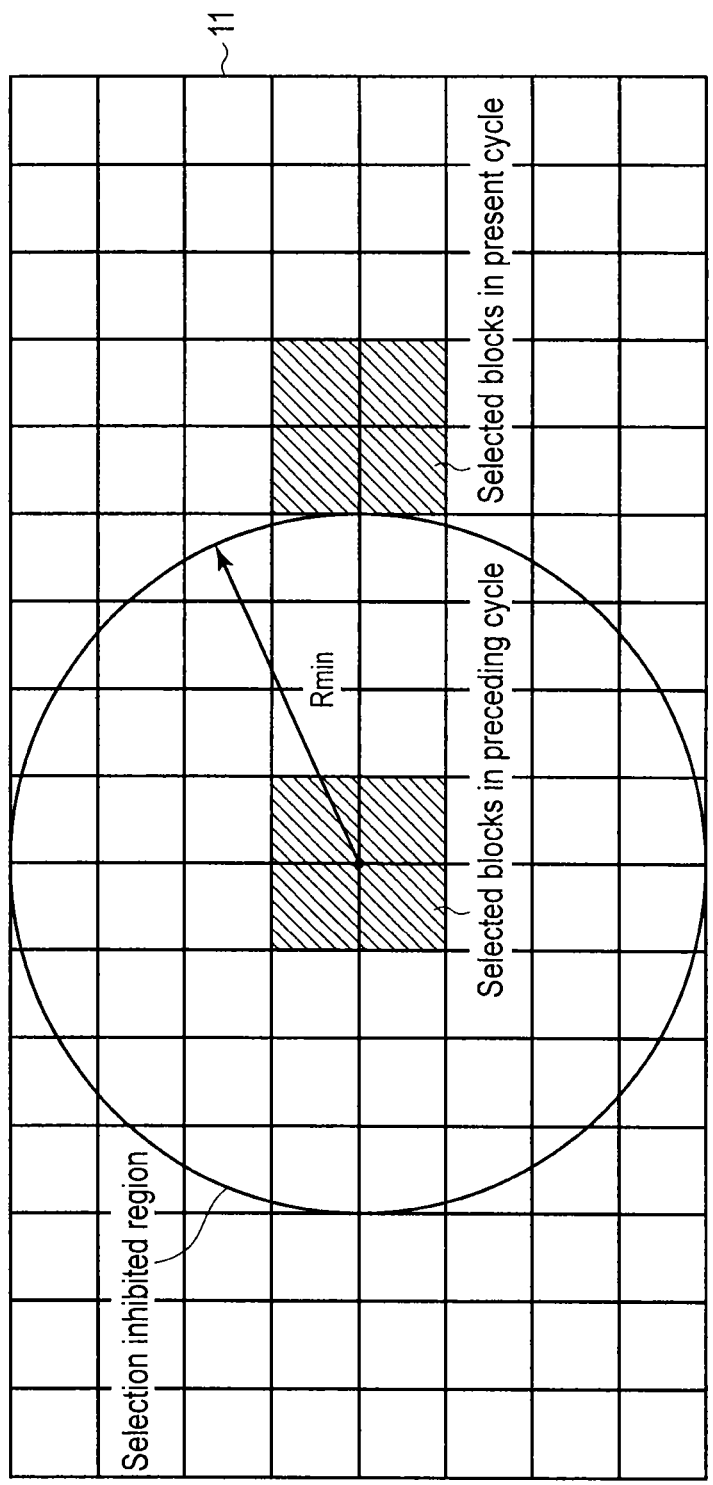
FIG. 30 is a view showing a selection inhibited region.

As shown in FIG. 30, for example, the selection inhibited block can be a block within the range of minimum distance $R_{min}$ from central point O of blocks selected in the past (one of the templates shown in FIG. 27). Minimum distance $R_{min}$ can be selected from the $R_{min}$ lookup table stored in information storage portion 6-2, e.g., the $R_{min}$ lookup table shown in FIG. 28.

Based on the selection inhibited block, selectable block determination portion 6-3b determines a block selectable in one cycle of a specific operation to be executed. If no selectable block exists, selectable block determination portion 6-3b instructs temporary selected block determination portion 6-3c to determine whether a temporary selected block exists.

If no temporary selected block exists, temporary selected block determination portion 6-3c instructs waiting portion 6-3d to wait for a predetermined period.

After waiting for the predetermined period, waiting portion 6-3d instructs selection inhibited block determination portion 6-3a to determine a selection inhibited block again.

On the other hand, the selected block information stored in information recording portion 6-2 changes with time. For example, information control portion 6-3h stores, in information storage portion 6-2, a block selected in the past (one of the templates shown in FIG. 27), and operation end time $t_{end}$ of the specific operation in the selected block, as the selected block information. Also, information control portion 6-3h includes, e.g., a timer, and erases, from information storage portion 6-2, selected block information for which temperature relaxation time $t_{relax}$ has elapsed from operation end time $t_{end}$ of the specific operation.

Accordingly, if neither a selectable block nor a temporary selected block exists, waiting portion 6-3d forms a predetermined waiting period. Consequently, a selectable block always exists when selection inhibited block determination portion 6-3a determines a selection inhibited block again.

Furthermore, if no selectable block exists and a temporary selected block exists, temporary selected block determination portion 6-3c sets the temporary selected block as a finally determined selected block without issuing any waiting instruction to waiting portion 6-3d. In addition, temporary selected block determination portion 6-3c instructs selected block position output portion 6-3f to output the position of the finally determined selected block.

At this point of time, the number of selected blocks has not reached the total number of selected blocks necessary for write of all data.

Accordingly, repetition determination portion 6-3g determines whether the sum of the blocks selected so far has reached the total number of selected blocks. If the sum of the selected blocks has not reached the total number of selected blocks, repetition determination portion 6-3g instructs selection inhibited block determination portion 6-3a to determine a selection inhibited block again.

Thus, whether to perform the next cycle is determined based on the instructions from repetition determination portion 6-3g.

If a selectable block exists, selectable block determination portion 6-3b notifies temporary selector 6-3e of the selectable block.

As shown in FIG. 30, for example, temporary selector 6-3e determines temporary selected blocks (one of the templates shown in FIG. 27) based on the selected block total number from selected block total number determination portion 6-1 and the selectable block from selectable block determination portion 6-3b.

If all blocks required to write all data are selectable, temporary selector 6-3e selects all these blocks and instructs selected block position output portion 6-3f to output position information of the selected blocks.

At this point of time, the sum of the selected blocks has reached the selected block total number, so repetition determination portion 6-3g does not instruct selection inhibited block determination portion 6-3a to determine a selection inhibited block again.

If not all blocks necessary to write all data are not selectable, temporary selector 6-3e instructs selectable block determination portion 6-3b to determine whether a selectable block exists again.

In accordance with this instruction from temporary selector 6-3e, selectable block determination portion 6-3b determines a selectable block based on the selection inhibited block.

Information control portion 6-3f stores, in information storage portion 6-2, the blocks selected in this cycle (one of the templates shown in FIG. 27), and operation end time $t_{end}$ of the specific operation of the selected blocks, as selected block information.

Also, as already described above, information control portion 6-3f manages temperature relaxation time $t_{relax}$, and erases, from information storage portion 6-2, selected block information for which temperature relaxation time $t_{relax}$ has elapsed from operation end time $t_{end}$ of the write operation.

Note that whether temperature relaxation time $t_{relax}$ has elapsed is desirably periodically determined at a predetermined interval shorter than temperature relaxation time $t_{relax}$.

In this example, the memory capacity of information storage portion 6-2 increases because information storage portion 6-2 stores the selected block templates, $R_{min}$ lookup table, and $t_{relax}$ lookup table.

Also, when controlling the temperature by the state machine as in the example shown in FIGS. 21 and 22, the memory capacity of information storage portion 6-2 is restricted in some cases. In this case, the selected block templates, $R_{min}$ lookup table, and $t_{relax}$ lookup table may also be stored in the controller for controlling the memory chip.

FIG. 31 shows a nonvolatile semiconductor memory according to the second modification of the write/erase/read operation explained with reference to FIGS. 21, 22, 23, 24, and 25.

This nonvolatile semiconductor memory has the feature that the chip contains temperature sensor 9. Temperature sensor 9 is, e.g., a diode sensor, and detects the chip temperature in real time. An operation to be explained in this modification has the feature that a normal operation and temperature relaxing operation are switched based on the chip temperature rise value (maximum value $t_{max}$ of the temperature rise value of a specific operation) detected by temperature sensor 9.

Note that temperature sensor 9 is incorporated into the chip in the modification shown in FIG. 31, but temperature sensor 9 may also be embedded outside the nonvolatile semiconductor memory (memory chip).

For example, in a modification shown in FIG. 32, controller 20 and memory chip 10 are stacked on printed circuited board 31. Also, temperature sensor 9 is mounted on memory chip 10. Furthermore, memory chip 10, controller 20, and temperature sensor 9 are encapsulated by package 32.

As another example, in a modification shown in FIG. 33, memory chip 10 and controller 20 are juxtaposed on printed circuit board 31. Also, temperature sensor 9 is set in a position adjacent to memory chip 10.

FIG. 34 shows an arrangement for switching the normal operation and temperature relaxing operation.

This arrangement can be implemented by state machine 6 or controller 20 in the nonvolatile semiconductor memory.

The chip temperature rise value obtained in real time by temperature sensor 9 is transferred to state machine 6 or controller 20. State machine 6 or controller 20 executes the following operation based on this temperature information.

First, whether the chip temperature rise value, i.e., maximum value $t_{max}$ of the chip temperature rise value has exceeded first threshold value $t_{high}$ is determined. First threshold value $t_{high}$ is slightly lower than above-described tolerance $t_{limit}$ of the temperature rise value. For example, when tolerance $t_{limit}$ of the temperature rise value is 45° C., first threshold value $t_{high}$ is desirably 40° C.

If maximum value $t_{max}$ of the temperature rise value is equal to or smaller than first threshold value $t_{high}$, the speed of the write/erase/read operation is increased by performing the normal operation. If maximum value $t_{max}$ of the temperature rise value has exceeded first threshold value $t_{high}$, the temperature relaxing operation as already explained above is executed, thereby preventing the chip temperature rise value from exceeding tolerance $t_{limit}$.

For example, as shown in FIG. 35, the write/erase/read operation is continuously executed in the normal operation without inserting any temperature relaxing operation, so the operation speed can be increased. However, maximum value $t_{max}$ of the chip temperature rise value gradually increases.

Accordingly, the normal operation is switched to the temperature relaxing operation when maximum value $t_{max}$ of the chip temperature rise value has exceeded first threshold value $t_{limit}$ slightly lower than tolerance $t_{limit}$.

When the temperature relaxing operation is inserted after one cycle of the write/erase/read operation is completed, maximum value $t_{max}$ of the chip temperature rise value gradually decreases. Therefore, maximum value $t_{max}$ of the chip temperature rise value does not exceed tolerance $t_{limit}$ of the chip temperature rise value.

Also, if the temperature relaxing operation is always executed, the speed of the write/erase/read operation becomes difficult to increase. Therefore, second threshold value $t_{low}$ lower than first threshold value $t_{high}$ is set.

Then, whether the chip temperature rise value, i.e., maximum value $t_{max}$ of the chip temperature rise value is lower than second threshold value $t_{low}$ is determined. Since second threshold value $t_{low}$ is preferably not too low and not too high, an optimum value is predetermined by simulation. For example, when tolerance $t_{limit}$ of the chip temperature rise value is 45° C., second threshold value $t_{low}$ is desirably 35° C.

If maximum value $t_{max}$ of the temperature rise value is lower than second threshold value $t_{low}$, the temperature relaxing operation is switched to the normal operation, thereby increasing the speed of the write/erase/read operation. If maximum value $t_{max}$ of the temperature rise value is equal to or higher than second threshold value $t_{low}$, the temperature relaxing operation is continuously executed, thereby preventing the chip temperature rise value from exceeding tolerance $t_{limit}$.

Note that the normal operation and temperature relaxing operation are switched by using first and second threshold values $t_{high}$ and $t_{low}$ in this modification, but the present invention is not limited to this, and various modifications are possible. For example, the normal operation can be switched to the temperature relaxing operation after the normal operation is continuously executed a predetermined number of cycles or for a predetermined time. Likewise, the temperature relaxing time can be switched to the normal operation after the temperature relaxing operation is continuously executed by a predetermined number of cycles or for a predetermined time.

Also, since the chip temperature rise value detected by temperature sensor 9 is a global temperature value in the chip, it is possible to perform a correction process of converting this global temperature value into a local temperature value in the chip. This correction process is implemented by preobtaining the relationship between the global temperature value and local temperature value based on simulation or actual measurement during a test.

As described above, it is possible by switching the normal operation and temperature relaxing operation to form a system in which a high-speed operation is executed when the write/erase/read data amount is small and the normal operation is switched to the temperature relaxing operation when the write/erase/read data amount is large, thereby performing stabler operations.

Temperature sensor 9 of this modification can also be used to perform correction depending on the global temperature in the read operation. Correction depending on the global temperature in the read operation will be explained below. As the chip temperature changes, the electrical characteristics of internal elements such as diodes forming an integrated circuit change, and this fluctuates the current value in the read operation.

Accordingly, the changes in electrical characteristics of internal elements caused by temperature changes are preobtained, and the electrical characteristics of the internal elements are corrected based on the temperature information of temperature sensor 9. This makes it possible to prevent the fluctuation in current value caused by the temperature change in the read operation, and acquire correct memory information.

Also, the information obtained by temperature sensor 9 is global information. In addition to this information, therefore, it is possible to predict a local temperature rise value in the periphery of a selected block from above-described equation (1), and correct the electrical characteristics of the internal elements by using this local temperature rise value.

As described above, the embodiment can implement a thermal engineering technique by taking account of a local temperature distribution when a semiconductor memory device is actually operating.

Note that in order to efficiently perform an algorithm according to the above-described embodiment, data to be written in a chip is desirably distributed to blocks spaced apart from each other in the chip. In addition, of data already written in a chip, data densely written in adjacent blocks can be distributed to blocks space apart from each other by moving the data in the chip.

Furthermore, when write data are stored as they are distributed to blocks spaced apart from each other in low-rate data write, it is possible to erase these data by simultaneously selecting the blocks containing the data.

When controlling the temperature managing operation of this embodiment by using a controller, the controller and a memory chip can be incorporated into one LSI device (e.g., an electronic device such as a memory card or USB), and it is also possible to use a host apparatus such as a personal computer as the controller.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array which includes blocks arranged in an n×m matrix (both n and m are natural numbers of not less than 2), and in which each of the blocks is capable of executing a write, read, or erase operation independently of other blocks; and
   a control portion which is configured to
   execute the write, read, or erase operation of a first block among the blocks in a first cycle;
   set a selection inhibited region within a range of a predetermined distance from the first block, until a temperature relaxation time for relaxing a temperature of the first block and a temperature around the first block which are raised by executing the first cycle has elapsed,
   set a region except the selection inhibited region among the blocks as a second block, and
   execute the write, read, or erase operation of the second block in a second cycle.

2. The device of claim 1,
   wherein the temperature relaxation time of the first block is determined based on an operation time during which the first block executes the write, read, or erase operation in the first cycle.

3. The device of claim 2,
   wherein $t_{relax}=K \times t_{set}$,
   where $t_{relax}$ is the temperature relaxation time of the first block,
   $t_{set}$ is the operation time during which the first block executes the write, read, or erase operation in the first cycle, and
   K is a coefficient.

4. The device of claim 1,
   wherein the temperature relaxation time of the first block is determined by looking up a table indicating a relationship between the write, read, or erase operation executed in the first block and the temperature relaxation time, based on a type of the write, read, or erase operation executed in the first block in the first cycle.

5. The device of claim 1,
wherein the predetermined distance is determined by looking up a table indicating a relationship between the write, read, or erase operation executed in the first block and the predetermined distance, based on a type of the write, read, or erase operation executed in the first block in the first cycle.

6. The device of claim 1,
wherein the control portion comprises a storage portion configured to store a block information indicating a position of the first block, and
the block information is erased after the temperature relaxation time has elapsed from an end time of the write, read, or erase operation in the first block.

7. The device of claim 6,
wherein the control portion periodically determines whether to erase the block information in an interval shorter than the temperature relaxation time.

8. The device of claim 1,
wherein the control portion sets the selection inhibited region within the range of the predetermined distance from a central point of the first block,
sets a block having a central point in the selection inhibited region as a selection inhibited block, and
selects the second block from blocks except the selection inhibited block.

9. The device of claim 7,
wherein the control portion comprises a storage portion configured to store a selection inhibited block information indicating a position of the selection inhibited block, and
the selection inhibited block information is erased after the temperature relaxation time has elapsed from an end time of the write, read, or erase operation in the first block.

10. The device of claim 1,
wherein the control portion selects the second block again after a predetermined period, when all the blocks exist in the selection inhibited region in a selection of the second block.

11. The device of claim 1,
wherein the first and second blocks are selected from a template including patterns preformed to select the blocks.

12. The device of claim 11,
wherein the temperature relaxation time of the first block is determined by looking up a table indicating a relationship between the patterns, an operation time of the write, read, or erase operation executed by the first block in the first cycle, and the temperature relaxation time, based on a pattern of the first block and the operation time.

13. The device of claim 11,
wherein the predetermined distance is determined by looking up a table indicating a relationship between the patterns and the predetermined distance, based on patterns of the first block.

14. The device of claim 1,
wherein the control portion has a function of switching a temperature relaxing operation of selecting the second block from a region except the selection inhibited region, and a normal operation of freely selecting the second block from the blocks, and
the control portion executes the temperature relaxing operation when a temperature of the chip is higher than a first threshold value, and executes the normal operation when the temperature of the chip is lower than a second threshold value lower than the first threshold value.

15. The device of claim 14, further comprising:
a temperature sensor configured to detect a temperature of a chip including the memory cell array,
wherein whether to switch the normal operation and the temperature relaxing operation is determined based on the temperature of the chip detected by the temperature sensor.

16. The device of claim 1,
wherein each of the blocks comprises a word line and a bit line intersecting each other, and a resistance change element connected between the word line and the bit line.

17. The device of claim 1,
wherein the control portion comprises a state machine embedded in a chip including the memory cell array.

18. The device of claim 1,
wherein the control portion comprises a controller embedded in a chip different from a chip including the memory cell array.

19. A method of controlling a semiconductor memory device having a memory cell array which includes blocks arranged in an n×m matrix (both n and m are natural numbers of not less than 2), and in which each of the blocks is capable of executing a write, read, or erase operation independently of other blocks,
the method comprising:
executing the write, read, or erase operation of a first block among the blocks in a first cycle;
setting a selection inhibited region within a range of a predetermined distance from the first block, until a temperature relaxation time for relaxing a temperature of the first block and a temperature around the first block which are raised by executing the first cycle has elapsed,
setting a region except the selection inhibited region among the blocks as a second block, and
executing the write, read, or erase operation of the second block in a second cycle.

20. The method of claim 19,
wherein the method is executed by a control portion which controls each of the blocks independently.

* * * * *